United States Patent
Tomoda et al.

(10) Patent No.: US 6,873,092 B2
(45) Date of Patent: Mar. 29, 2005

(54) DISPLAY UNIT

(75) Inventors: Katsuhiro Tomoda, Kanagawa (JP); Toyoharu Oohata, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/192,309

(22) Filed: Jul. 10, 2002

(65) Prior Publication Data

US 2003/0015959 A1 Jan. 23, 2003

(30) Foreign Application Priority Data

Jul. 11, 2001 (JP) .................................... P2001-211255

(51) Int. Cl.$^7$ ................................................ H01J 1/02
(52) U.S. Cl. ...................... 313/112; 313/512; 313/110; 313/506; 257/98
(58) Field of Search ................................ 313/498, 512, 313/499, 501, 110, 112, 113, 114, 506; 257/98, 100; 362/800, 241, 243, 247

(56) References Cited

U.S. PATENT DOCUMENTS

| | | | |
|---|---|---|---|
| 5,438,241 A | | 8/1995 | Zavracky et al. |
| 5,813,753 A | * | 9/1998 | Vriens et al. ............... 362/293 |
| 6,275,338 B1 | * | 8/2001 | Arai et al. ................... 359/599 |
| 6,552,778 B1 | * | 4/2003 | Konagaya ..................... 355/71 |
| 6,607,286 B2 | * | 8/2003 | West et al. .................. 362/255 |
| 6,611,280 B1 | * | 8/2003 | Shiraishi et al. ............ 347/238 |

FOREIGN PATENT DOCUMENTS

JP          11-142878          5/1999

* cited by examiner

Primary Examiner—Edward J. Glick
Assistant Examiner—Elizabeth Keaney
(74) Attorney, Agent, or Firm—Bell, Boyd & Lloyd, LLC

(57) ABSTRACT

A display unit includes light emitting devices arrayed in such a manner as to be spaced from each other, and a sealing material for covering the surfaces of the light emitting devices, wherein the sealing material has a light diffusion function. The light diffusion function is given to the sealing material by providing a reflection mirror and a half mirror in the sealing material, dispersing, in the sealing material, fine particles having a refractive index different from that of the sealing material, or dispersing bubbles in the sealing material. Since the light diffusion function is given to the sealing material, the light emission region of each of the light emitting devices is substantially enlarged to a size nearly equal to an array pitch of the light emitting devices, to thereby obtain an image display excellent in viewability.

2 Claims, 23 Drawing Sheets

DISPLAY UNIT

BACKGROUND OF THE INVENTION

The present invention relates generally, to a display unit including light emitting devices arrayed in such a manner as to be spaced from each other and, more particularly, to a display unit in which a light emission region of each of the light emitting devices is enlarged by giving a light diffusion function to a sealing material for covering the light emitting devices.

The assembly of an image display unit by arraying light emitting devices in a matrix is performed in two manners. For a liquid crystal display (LCD) or a plasma display panel (PDP), the light emitting devices are directly formed on a substrate, and for a light emitting diode display (LED display), single LED packages are arrayed on a substrate. In particular, for an image display unit such as an LCD or PDP, device isolation cannot be performed. Accordingly, in general, at the beginning of the production process, devices are formed in such a manner as to be spaced from each other with a pitch equivalent to a pixel pitch of the image display unit.

On the other hand, for an image display unit such as an LED display, LED chips are packaged by taking out LED chips after dicing, and individually connecting the LED chips to external electrodes by wire-bonding or bump-connection using flip-chip. In this case, before or after packaging, the LED chips are arrayed with a pixel pitch of the image display unit. However, such a pixel pitch is independent from an array pitch of the devices at the time of formation of the devices.

Since an LED (Light Emitting Diode) as a light emitting device is expensive, an image display unit using such LEDs can be produced at a low cost by producing a large number of LED chips from one wafer. Specifically, the cost of an image display unit can be lowered by reducing the size of an LED chip from an ordinary size, about 300 $\mu$m square to several ten $\mu$m square, and producing an image display unit by connecting such small-sized LED chips to each other. From this viewpoint, various techniques are known of forming devices at a high density, and transferring the devices to a wide region in such a manner that the devices are enlargedly spaced from each other, to produce a relatively large display unit such as an image display unit. For example, U.S. Pat. No. 5,438,241 discloses a thin film transfer method, and Japanese Patent Laid-open No. Hei 11-142878 discloses a method of forming a transistor array panel for display.

It should be noted, in the above-described display unit in which light emitting diodes are arrayed in such a manner as to be spaced from each other, since a light emission region of each of the light emitting devices forming pixels is significantly smaller than an array pitch of the light emitting devices, the light emission devices become conspicuous as luminous spots on a screen, thereby causing a problem in significantly degrading the image quality. Even if an average brightness over the screen has a suitable value, each light emitting diodes having a small-size glares as a luminous spot on the screen, thereby failing to obtain an image display excellent in viewability.

SUMMARY OF THE INVENTION

An object of the present invention is to provide a display unit capable of enlarging a light emission region of each of the light emitting devices, thereby allowing an image display excellent in viewability.

Another object of the present invention is to provide a display unit capable of moderating a light emission characteristic due to the shape of each of the light emitting devices, thereby improving uniformity of viewing angle.

A further object of the present invention is to provide a display unit capable of improving the light emergence efficiency, and freely setting a size of a light emission region of a pixel.

To achieve the above objects, according to an embodiment of the present invention, there is provided a display unit including light emitting devices arrayed in such a manner as to be spaced from each other, and a sealing material for covering the surfaces of the light emitting devices, wherein the sealing material has a light diffusion function.

The light diffusion function may be given to the sealing material by providing a reflection mirror and a half mirror in the sealing material; dispersing, in the sealing material, fine particles having a refractive index different from that of the sealing material, or dispersing bubbles in the sealing material.

Since the light diffusion function is given to the sealing material, the light emission region of each of the light emitting devices is substantially enlarged to a size nearly equal to an array pitch of the light emitting devices. As a result, the light emitting devices are not conspicuous as luminous spots on the screen. Therefore, the screen is luminous as a whole, thereby obtaining image display excellent in viewability. Each of the methods of giving the light diffusion function has an advantage inherent thereto. For example, in the case of giving the light diffusion function by the combination of the reflection mirror and the half mirror, it is possible to freely set the size of the light emission region of each of the light emitting devices forming a pixel by adjusting the reflectance or transmittance of the half mirror. In the case of giving the light emission function by dispersing fine particles or bubbles having a refractive index different from that of the sealing material, it is possible to moderate the light emission directional characteristic due to the shape of each of the light emitting devices, and hence to improve the uniformity of viewing angle. In the case of giving the light diffusion function by dispersing fine particles or bubbles with a specific periodicity, it is possible to give the photonic crystal characteristic to the sealing material, and hence to improve the light emergence efficiency.

Additional features and advantages of the present invention are described in, and will be apparent from, the following Detailed Description of the Invention and the Figures.

DETAILED DESCRIPTION OF THE INVENTION

A display unit of the present invention includes light emitting devices such as light emitting diodes arrayed on a substrate in a matrix, wherein the light emitting devices are selectively driven so as to display an image. The light emitting devices are arrayed in a state being enlargedly spaced from each other with a pitch larger than the size of each of the devices. The surfaces of the light emitting devices are covered with a sealing material for protecting the devices.

The display unit of this type in which the light emitting devices are arrayed in such a manner as to be enlargedly spaced from each other, however, has an inconvenience that each of the devices is conspicuous as a luminescent spot on a screen. To cope with such an inconvenience, according to the present invention, a light diffusion function is given to the sealing material covering the light emitting devices.

The light diffusion function given to the sealing material will be described below by way of preferred embodiments of the present invention.

Figure 1:
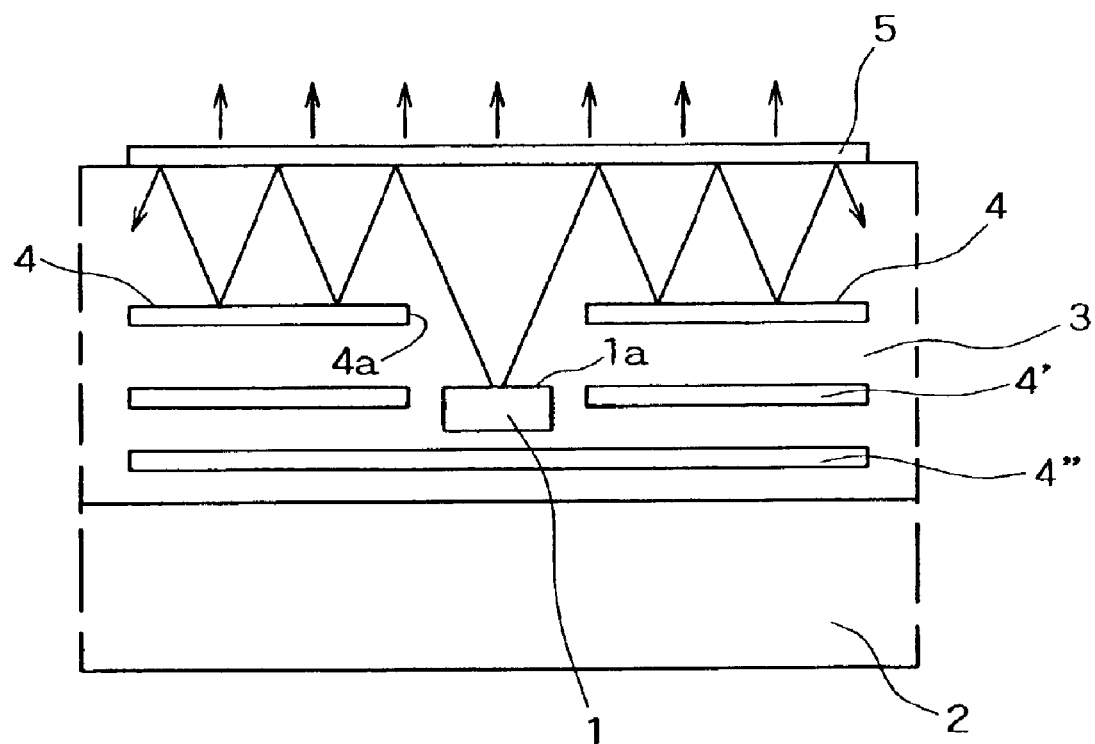
FIG. 1 is a typical view showing an embodiment and display unit in which a light diffusion function is given by a combination of a reflection mirror and a half mirror.

FIG. 1 is a schematic view showing an embodiment that the light diffusion function is given by providing a combination of a reflection mirror and a half mirror. A light emitting device 1 is mounted on a substrate 2, and the surface of the light emitting device 1 is covered with a sealing material 3. In this embodiment, a reflection mirror 4 is disposed in the sealing material 3 at a position near the light emergence side of the light emitting device 1, and a half mirror 5 is formed on the surface of the sealing material 3. With this configuration, light rays emitted from the light emitting device 1 are repeatedly reflected between the reflection mirror 4 and the half mirror 5, to be thereby spread in an in-plane direction.

The reflection mirror 4 may be provided at a position offset slightly, forwardly from a light emergence plane 1a of the light emitting device 1, and the reflection mirror 4 has an opening 4a at a position corresponding to the light emitting device 1. It is to be noted that the reflection mirror 4 is not necessarily provided in front of the light emitting device 1 but may be provided at the same height position (denoted by reference numeral 4' in the FIG. 1) as that of the light emitting device 1 or provided at a position (denoted by reference numeral 4" in the FIG. 1) rearwardly from the light emitting device 1. In particular, if the reflection mirror 4 is provided rearwardly from the light emitting device 1, it is possible to eliminate the need of provision of the opening in the reflection mirror 4. In this case, the reflection mirror 4 with no opening contributes to partial emergence of light rays spread on the back surface side of the light emitting device 1, to thereby improve the light emergence efficiency. The half mirror 5, which is formed on the outermost surface of the sealing material 3 in such a manner as to face to the reflection mirror 4, has no opening, unlike the reflection mirror 4. With this configuration, light rays emitted from the light emitting device 1 travel to the half mirror 5, where part of the light rays pass through the half mirror 5 and the remaining light rays are reflected from the half mirror 5. The light rays having been reflected from the half mirror 5 are reflected from the reflection mirror 4, to travel again to the half mirror 5, and part of the light rays pass through the half mirror 5, and the remaining light rays are reflected from the half mirror 5. Such reflection of the light rays is repeated. As a result, the light rays emitted from the light emitting device 1 is enlargedly spread in an in-plane direction, to thereby enlarge a light emission region of each of the light emitting devices 1 forming a pixel.

Figure 2:
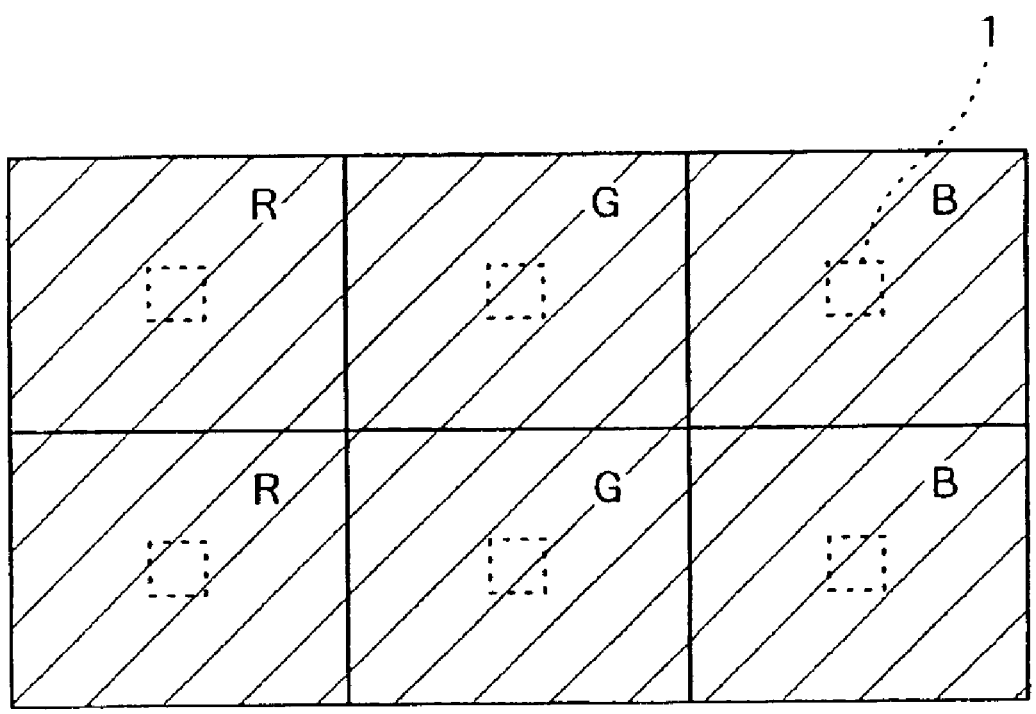
FIG. 2 is a typical view showing a light emission region of each of the light emitting devices of the display unit shown in FIG. 1, in which the light diffusion function is given.
Figure 3:
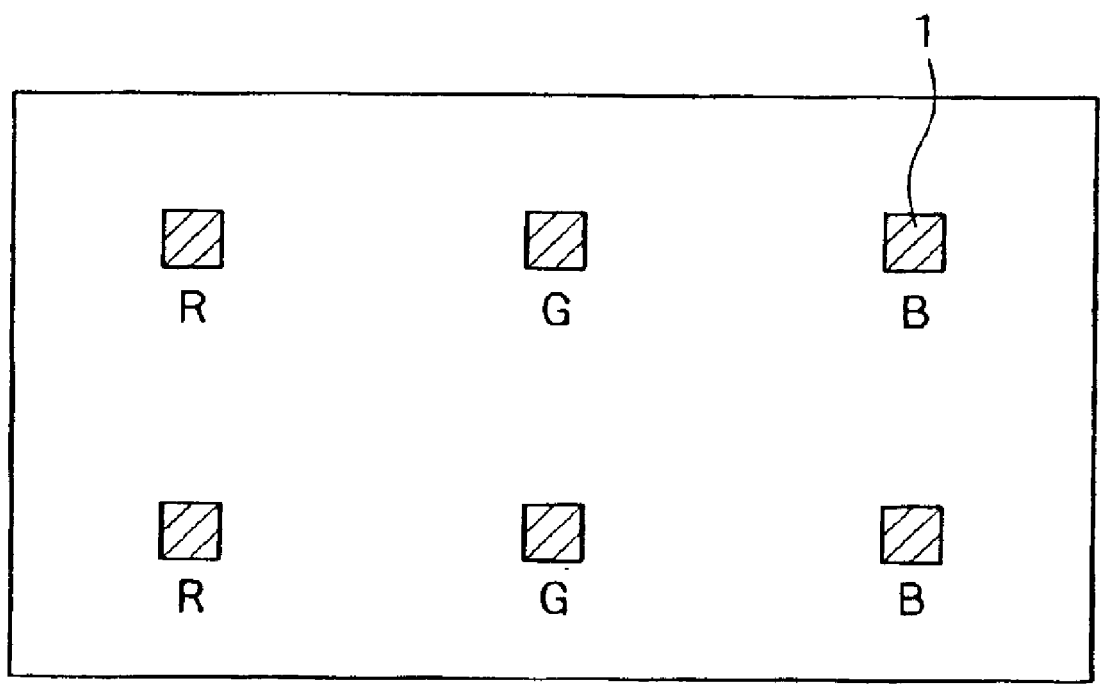
FIG. 3 is a typical view showing a light emission region of each of the light emitting devices of a comparative display unit in which any light diffusion function is not given.

The enlarged light emission region of the light emitting device 1 is shown in FIG. 2. In FIG. 2, character R denotes the light emitting device 1 for emission of red light, G is the light emitting device 1 for emission of green light, and B is the light emitting device 1 for emission of blue light. By enlargedly spreading light rays emitted from the light emitting device 1 by the reflection mirror 4 and the half mirror 5, the light emission region shown by hatching becomes significantly larger than the size of the light emitting device 1. As a result, the entire screen becomes uniformly luminous, to thereby obtain image display excellent in viewability. In the case where the light diffusion function by the reflection mirror 4 and the half mirror 5 is not given, as shown in FIG. 3, the light emission region of each light emitting device 1 is limited to the size of the light emitting device 1. Accordingly, since the size of each light emitting device 1 is smaller than the array pitch of the light emitting devices 1, each light emitting device 1 is conspicuous as a luminous spot, thereby failing to obtain an image display excellent in viewability.

Figure 4:
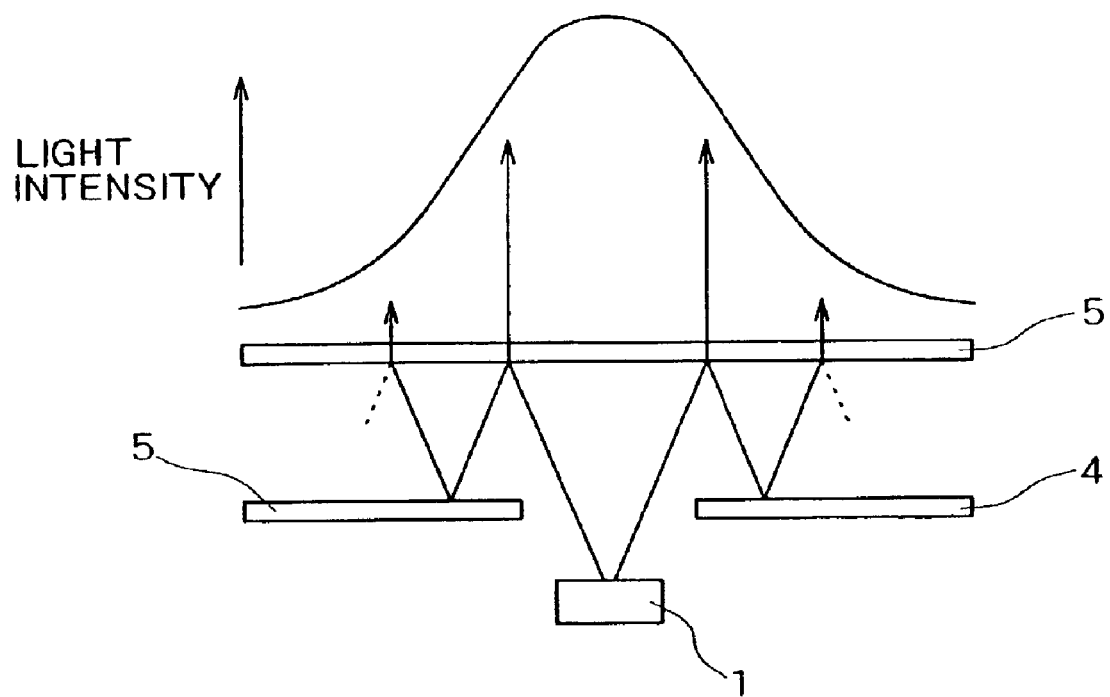
FIG. 4 is a graph showing a light intensity distribution for the case where the reflectance of a half mirror is small (the transmittance thereof is large).
Figure 5:
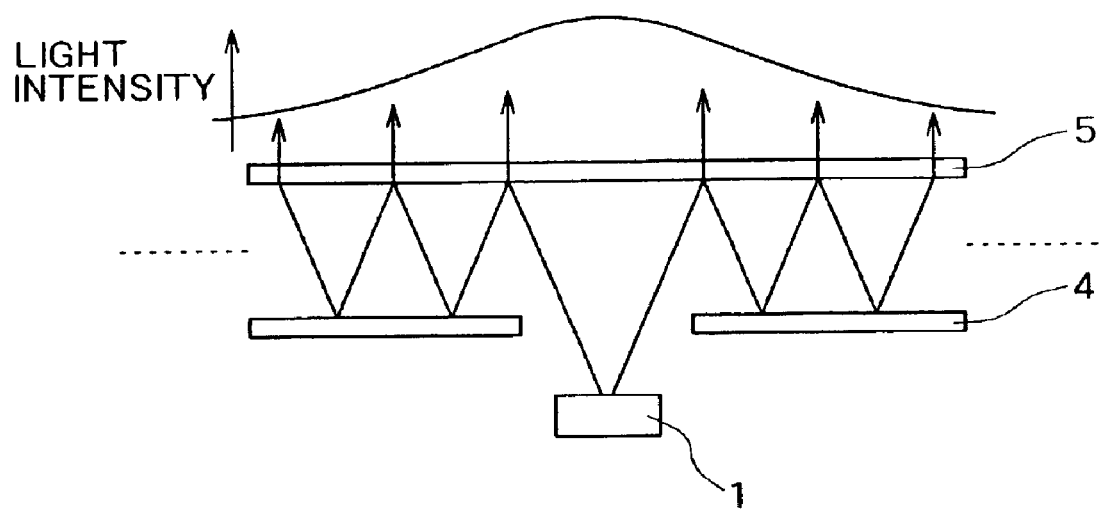
FIG. 5 is a graph showing a light intensity distribution for the case where the reflectance of the half mirror is large (the transmittance thereof is small).

In the case of enlargedly spreading light rays emitted from the light emitting device 1 by the combination of the reflection mirror 4 and the half mirror 5, the size of the light emission region of each of the light emitting devices 1 forming a pixel can be freely controlled by adjusting the reflectance or transmittance of the half mirror 5. For example, when the reflectance of the half mirror 5 becomes smaller (the transmittance becomes larger), most of the light rays pass through the half mirror 5 after being less reflected from the half mirror 5, so that the distribution of the light rays passing through the half mirror 5 becomes narrower as shown in FIG. 4, with a result that the light emission region of each of the light emitting devices 1 forming a pixel becomes smaller. On the contrary, when the reflectance of the half mirror 5 becomes larger (transmittance becomes smaller), the quantity of the light rays repeatedly reflected from the half mirror 5 becomes larger, so that the distribution of the light rays passing through the half mirror 5 becomes wider as shown in FIG. 5, with a result that the light emission region of the light emitting device 1 becomes larger.

Figure 6:
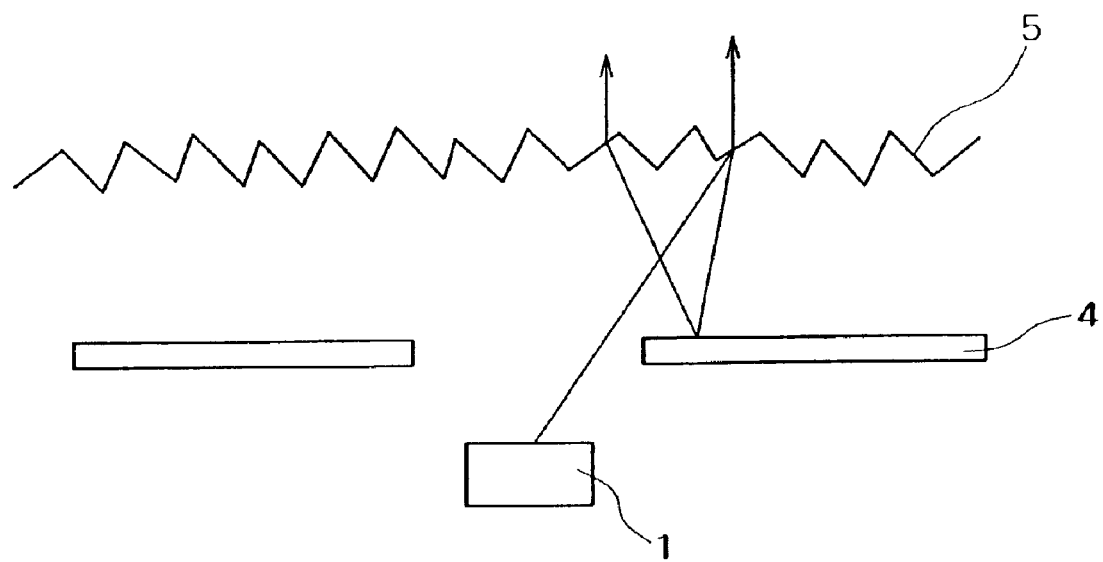
FIG. 6 is a typical view of a variation of the embodiment shown in FIG. 1, in which irregularities are formed on the half mirror.

The directivity of light rays passing through the half mirror 5 can be controlled by providing irregularities on the surface of the half mirror 5 as shown in FIG. 6. For example, the sealing material 3 is treated to have a specific texture for giving irregularities allowing light rays to emerge in the vertical direction to the half mirror 5, and the half mirror 5 is formed on the surface of the sealing material 3. Since the texture of the sealing material 3 is transferred to the half mirror 5, the irregularities are given to the half mirror 5. With this configuration, the light rays emerge from the half mirror 5 in the direction perpendicular to the screen, thereby significantly improving the visibility as seen from the front side of the screen.

Figure 7:
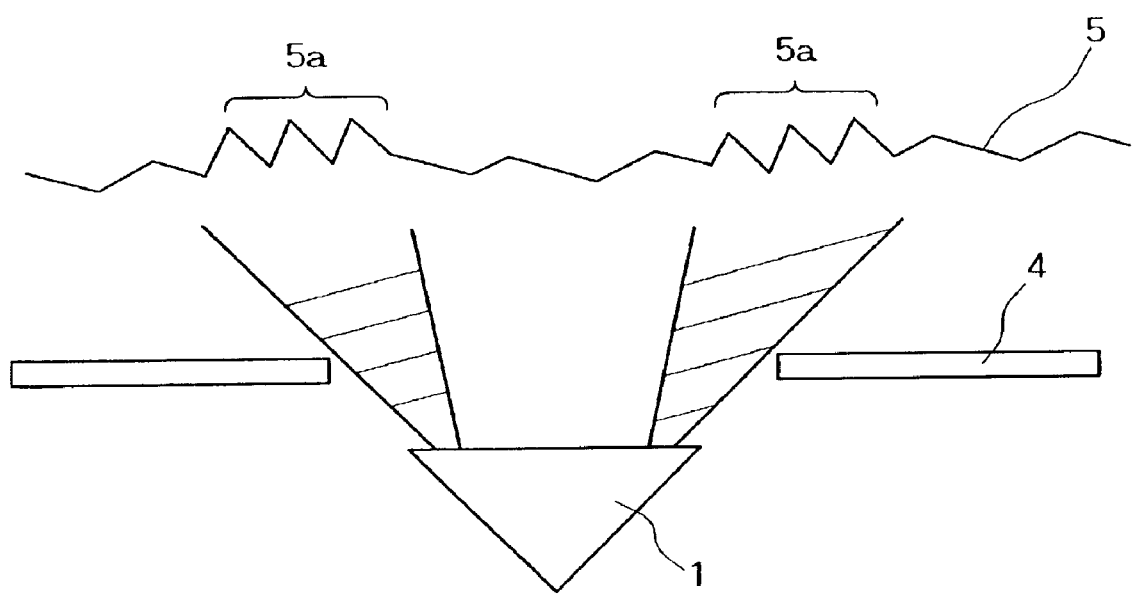
FIG. 7 is a typical view of another variation of the embodiment shown in FIG. 1, in which irregularities are formed on the half mirror.

The above texture is not limited to a random texture. For example, in the case where light rays intensively emerge in a specific direction due to the shape of the light emitting device 1, a texture having a periodicity to cancel the light rays in the specific direction may be given as shown in FIG. 7. In a variation of the embodiment, shown in FIG. 7, the light emitting device 1 has a tapered shape converged in one direction (for example, conical or polygonal shape), wherein light rays emerge from the bottom surface of the tapered device 1. For this light emitting device 1, light rays in a region hatched in the FIG. 7 intensively emerge. To cope with such an inconvenience, a region 5a, which is easier to diffuse light or has a high reflectance, is formed on the half mirror 5 at a position corresponding to the hatched region by transfer of the texture formed on the sealing material 3 to the half mirror 5. With this configuration, it is possible to equalize the intensity of light rays passing through the half mirror 5, and to improve the light emission directional characteristic due to the shape of the light emitting device 1 or the like and hence to improve the uniformity of viewing angle.

In the above-described embodiment, the light diffusion function is given to the sealing material by using the combination of the reflection mirror and the half mirror. However, the present invention is not limited thereto.

Figure 8:
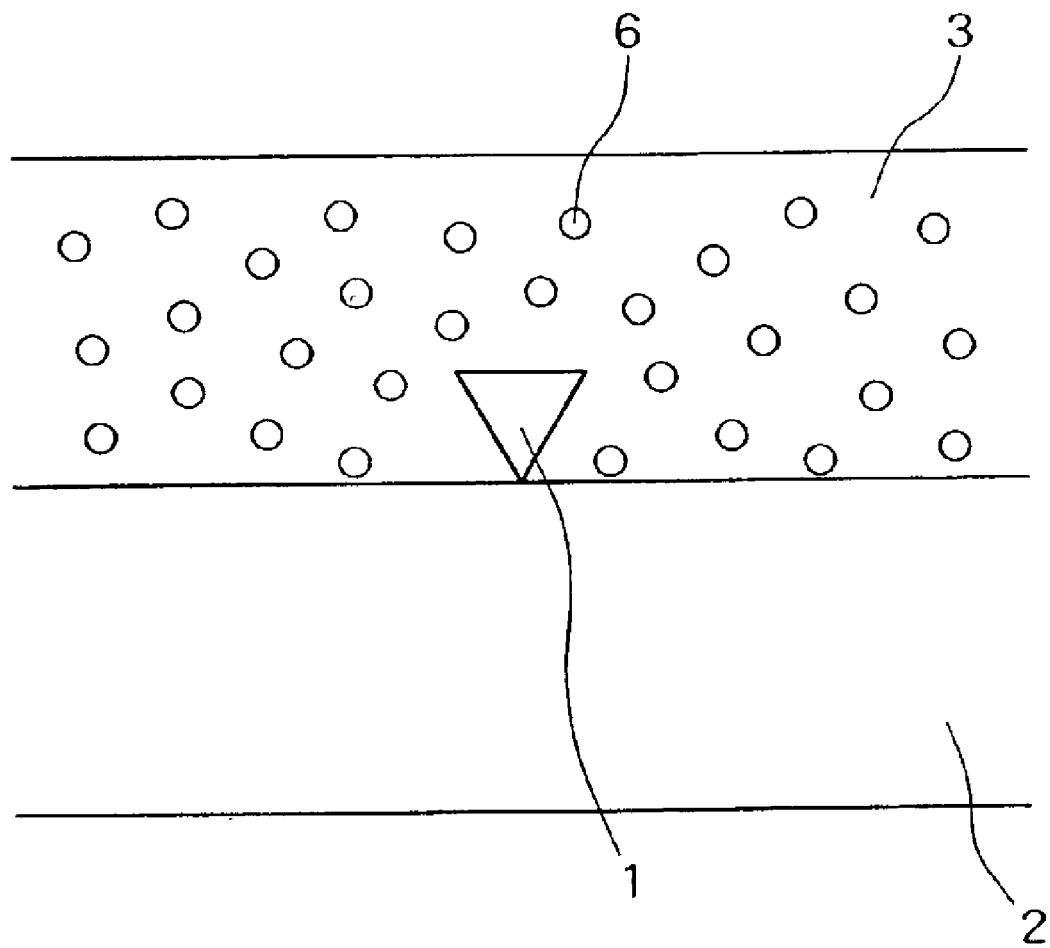
FIG. 8 is a typical view of another embodiment in which light diffusion beads are dispersed in a sealing material.
Figure 9:
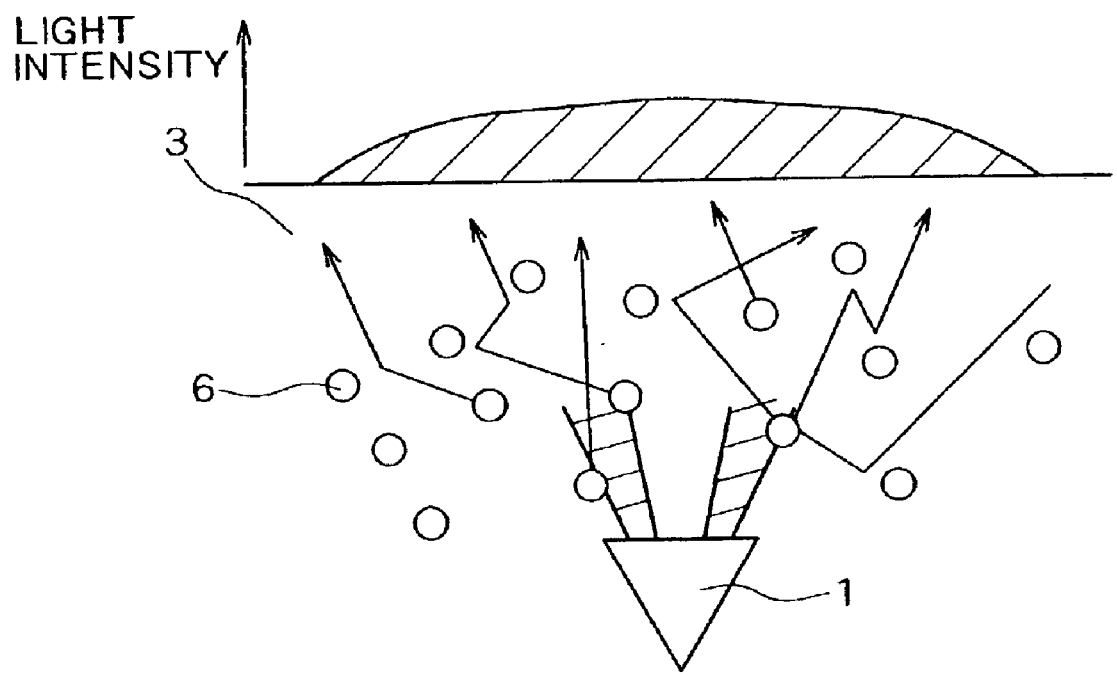
FIG. 9 is a typical diagram showing a diffused state of the light-diffusion beads shown in FIG. 8.

Another embodiment in which the light diffusion function is given by dispersing light-diffusion beads 6 in the sealing material 3 will be described below with reference to FIGS. 8 and 9. The light-diffusion beads 6 are fine particles, which have a refractive index different from that of the sealing material 3 and have spherical shapes or similar shapes thereto, although they may have other shapes. Since the light-diffusion beads 6 are dispersed in the sealing material 3, as shown in FIG. 9, light rays emerging from the light emitting device 1 are irregularly reflected from the light-diffusion beads 6. Accordingly, the intensity of the light rays having passed through the sealing material 3 is equalized, so that it is possible to improve the light emission directional characteristic due to the shape of the light emitting device 1 or the like, and hence to improve the uniformity of viewing angle.

Figure 10:
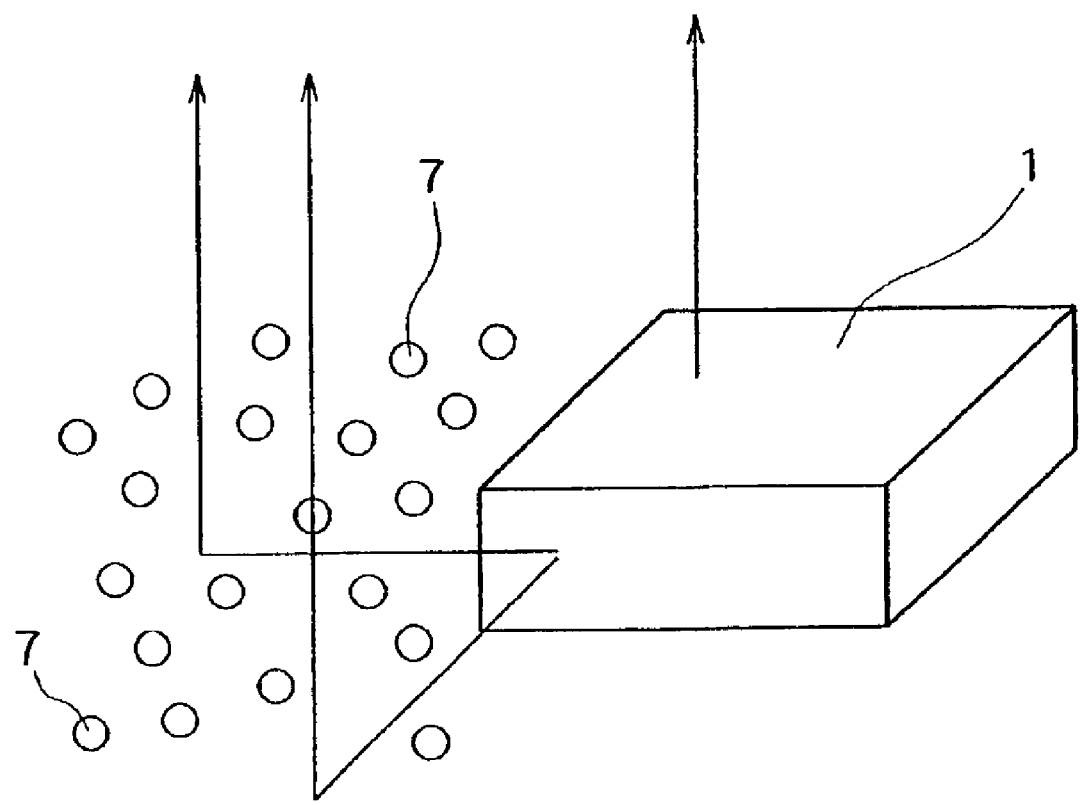
FIG. 10 is a typical view showing a further embodiment in which bubbles are dispersed in a sealing material.

A further embodiment in which the light diffusion function is given on the basis of the principle of a photonic crystal will be described below with reference to FIG. 10. The principle of a photonic crystal is that if a periodical refractive index distribution is given to a material, light having a wavelength in a specific range determined by the periodicity cannot travel in the material in a direction having the periodicity. For example, if in place of the above-described light-diffusion beads, bubbles 7 (refractive index: 1) having a size of sub-micron order are periodically dispersed in the sealing material having a large refractive index, the photonic crystal characteristic appears. In such a sealing material, emergence of light in the lateral direction, which is different from diffusion or scattering of light, can be obtained, so that the light emergence efficiency can be improved. The photonic crystal characteristic also can be obtained by periodically dispersing fine particles, having a refractive index different from that of the sealing material, in the sealing material.

It is to be noted that the photonic crystal characteristic used in the present invention is not particularly limited insofar as the photonic crystal characteristic appears by regularly disposing two kinds of transparent media being greatly different from each other in refractive index (dielectric constant) with a period of about a wavelength of light.

Various techniques of improving the light emission efficiency and the light emergence efficiency of a light emitting device by making use of a photonic crystal already have been studied. However, either of these techniques is generally configured such that openings are formed in a light emitting device; that is, a semiconductor device for example, in a triangular lattice shape, to produce a photonic crystal. In this case, the opened portions of the semiconductor device are wasted. On the contrary, according to this embodiment, since the light emission efficiency and the light emergence efficiency of the light emitting device 1 is improved by using the sealing material covering the light emitting device 1 as a photonic crystal, any portion of an expensive semiconductor device is not wasted. Accordingly, it becomes apparent that the improvement of the light emission efficiency and the light emergence efficiency of a light emitting device using a photonic crystal according to the present invention is based on a new technical thought.

As described above, the light emission region of each light emitting device can be enlarged to a size nearly equal to an array pitch of the light emitting devices. On the basis of the same technical thought, for example, three principal colors can be mixed with each other as described below. Such ideal mixture of three principal colors cannot be achieved by any other related art display unit.

Figure 11:
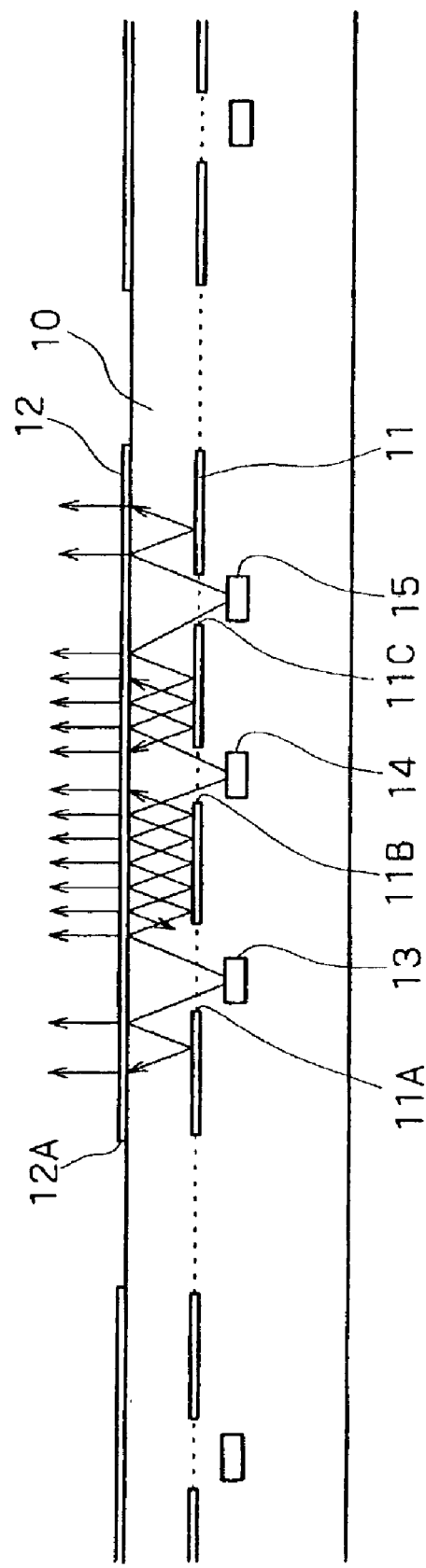
FIG. 11 is a typical view showing still a further embodiment in which three principal colors are mixed with each other.

A further embodiment in which three principal colors are mixed with each other by using a reflection mirror 11 and a half mirror 12 provided on a sealing material 10 will be described below with reference to FIG. 11. In this embodiment, a light emitting device 13 for emission of red color, a light emitting device 14 for emission of green color, and a light emitting device 15 for emission of blue color are disposed in the sealing material 10 in such a manner as to be spaced from each other in the horizontal direction, and the reflection mirror 11 having openings 11A, 11B and 11C located at positions corresponding to those of the light emitting devices 13, 14 and 15 respectively is also disposed in the sealing material 10 in such a manner as to be located over the light emitting devices 13, 14 and 15. The half mirror 12 having no opening, provided for each pixel, is separated from the adjacent half mirror 12 having no opening, provided for the next pixel, with an opening 12A put therebetween to prevent mixture of colors between the pixels. With this configuration, light rays emitted from each of the light emitting devices 13, 14 and 15 are repeatedly reflected from the reflection mirror 11 and the half mirror 12, so that a light emission region of the light emitting device is enlarged in an in-plane direction. As a result, a region in which three principal colors (R, G, and B) are mixed with each other appears as a light emission region of one pixel, to thereby obtain image display excellent in viewability.

The above-described configuration of the present invention can be applied to a display unit in which light emitting devices formed on an original substrate are transferred to and arrayed on a final substrate in such a manner as to be enlargedly spaced from each other by an enlarged transfer method.

A specific embodiment in which a display unit is produced by a two-step enlarged transfer method, wherein the above-described configuration regarding the light diffusion function is applied to the display unit will be described below.

The two-step enlarged transfer method, used for producing the display unit according to the present invention, is carried out by transferring devices formed on a first substrate at a high density to a temporary holding member in such a manner that the devices are enlargedly spaced from each other with a pitch larger than a pitch of the devices arrayed on the first substrate, and further transferring the devices held on the temporary holding member to a second substrate in such a manner that the devices are enlargedly spaced from each other with a pitch larger than the pitch of the devices held on the temporary holding member. It is to be noted that two-step transfer is adopted in this embodiment, multi-step transfer such as three or more-step transfer can be adopted in accordance with a required enlargement ratio between the pitch of the devices arrayed on the first substrate and the pitch of the devices mounted on the second substrate.

FIGS. 12A to 12D show basic steps of the two-step enlarged transfer method. First, devices 22 such as light emitting devices are densely formed on a first substrate 20 shown in FIG. 12A. By densely forming devices on a substrate, the number of devices formed per each substrate can be increased to reduce a production cost thereof. The first substrate 20 may be a substrate on which devices can be formed; for example, a semiconductor wafer, a glass substrate, a quartz glass substrate, a sapphire substrate, or a plastic substrate. The devices 22 may be directly formed on the first substrate 20, or may be formed once on a substrate different from the first substrate 20, and then transferred and arrayed on the first substrate 20.

Figure 12:
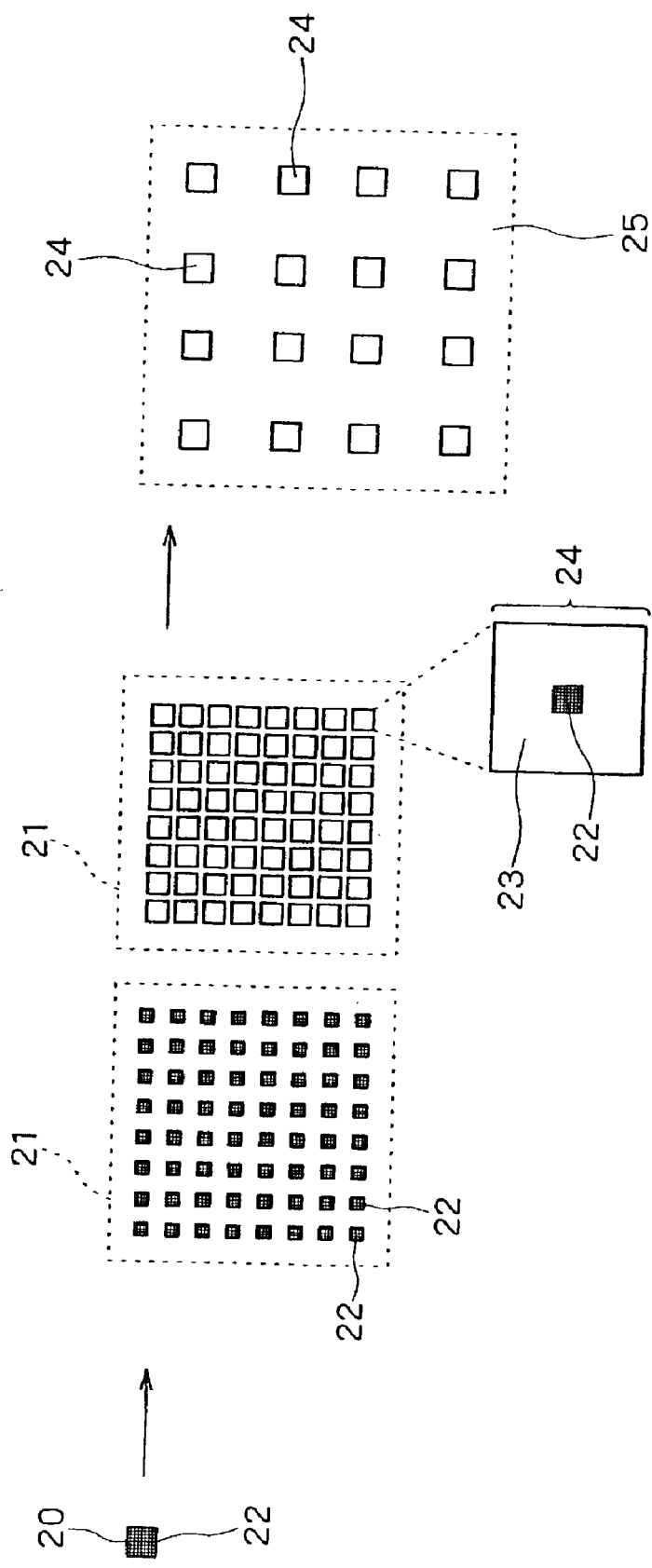
FIGS. 12A to 12D are typical views showing a method of arraying light emitting devices, which is used for a specific embodiment of the present invention regarding a display unit in which a light diffusion function is given to a sealing material.

The devices 22 are subjected to a first transfer step shown in FIG. 12B, in which the devices 22 are transferred from the first substrate 20 to a temporary holding member 21 shown by a broken line in FIG. 12B, and held on the temporary holding member 21. Here, as shown in FIG. 12B, the devices 22 are arrayed in a matrix in which the adjacent each of the devices 22 is enlargedly spaced from each other. Specifically, to array the devices 22 in the matrix shown in FIG. 12B, the transfer of the devices 22 is made such that the devices 22 are enlargedly spaced from each other not only in the X direction but also in the Y direction perpendicular to the X direction. The enlarged distance between the adjacent each of the devices 22 may be set, while not limited thereto, in consideration of production of resin-covered chips and formation of electrode pads thereon in the subsequent steps. In addition, when the devices 22 are transferred from the first substrate 20 to the temporary holding member 22, the devices 22 on the first substrate 20 all can be transferred to the temporary holding member 21 in such a manner as to be enlargedly spaced from each other. In this case, a size of the temporary holding member 21 in each of the X direction and the Y direction may be equal to or more than a value obtained by multiplying the enlarged distance by the number of those, arrayed in each of the X direction and the Y direction, of the devices 22 arrayed in the matrix. Alternatively, part of the devices 22 on the first substrate 20 may be transferred to the temporary holding member 21 in such a manner as to be enlargedly spaced from each other.

After the first transfer step, each of the devices 22 enlargedly spaced from each other on the temporary holding member 21 is, as shown in FIG. 12C, covered with a resin, and electrode pads are formed on the resin covering the device 22. The covering of each device 22 with the resin is made so as to facilitate the formation of the electrode pads for the device 22 and to facilitate the handling of the device 22 in a second transfer step subsequent thereto. To prevent occurrence of a wiring failure in a final wiring step, which is performed after the second transfer step as will be described later, the electrode pads are formed into relatively large sizes. It is to be noted that the electrode pads are not shown in FIG. 12C. As enlargedly shown in FIG. 12C, a resin-covered chip 24 (equivalent to a display device of the present invention) is thus formed by covering each of the devices 22 with a resin 23. The device 22 is located at an approximately central portion of the resin-covered chip 24 in a plan view according to this embodiment. However, the device 22 may be located at a position offset to one side or a corner of the resin-covered chip 24.

The devices 22 are then subjected to the second transfer step shown in FIG. 12D. In this second transfer step, the devices 22 arrayed in the matrix on the temporary holding member 21 in the form of the resin-covered chips 24 are transferred on a second substrate 25 in such a manner as to be more enlargedly spaced from each other.

Even in the second transfer step, the devices 22 are arrayed in a matrix shown in FIG. 12D, in which adjacent each of the devices 22 in the form of the resin-covered chips 24 are more enlargedly spaced from each other. Specifically, to array the devices 22 in the matrix shown in FIG. 12D, the devices 22 are transferred in such a manner as to be more enlargedly spaced from each other not only in the X direction but also in the Y direction perpendicular to the X direction. If positions of the devices 22 arrayed by the second transfer step correspond to positions of pixels of a final product such as an image display unit, a pitch of the devices 22 arrayed by the second transfer step becomes about integer times an original pitch of the devices 22 arrayed on the first substrate 20. It is now assumed that an enlargement ratio between the pitch of the devices 22 held on the temporary holding member 21 and the pitch of the devices 22 arrayed on the first substrate 20 is taken as "n" and an enlargement ratio between the pitch of the devices 22 arrayed on the second substrate 25 and the pitch of the devices 22 held on the temporary holding member 21 is taken as "m". On this assumption, a value E of the above-described about integer times is expressed by E=n×m.

The devices 22 in the form of the resin-covered chips 24, which have been transferred in the second substrate 25 in such a manner as to be sufficiently enlargedly spaced from each other, are then subjected to wiring. The wiring is performed with care taken not to cause a connection failure by making use of the previously-formed electrode pads and the like. If the devices 22 are light emitting devices such as light emitting diodes, the wiring includes wiring to p-electrodes and n-electrodes. If the devices 22 are liquid crystal control devices, the wiring includes wiring to selective signal lines, voltage lines, alignment electrode films, and the like.

In the two-step enlarged transfer method shown in FIGS. 12A to 12D, the covering of each of the devices 22 with a resin and the formation of electrode pads on the resin covering the device 22 (that is, the resin-covered chip 24) can be performed by making use of the enlarged distance between adjacent each of the devices 22 after the first transfer, and wiring can be performed after the second transfer without occurrence of any connection failure by making use of the previously-formed electrode pads and the like. As a result, it is possible to improve a production yield of the image display unit. Also, in the two-step enlarged transfer method according to this embodiment, two enlarged transfer steps in each of which the devices are enlargedly spaced from each other are carried out. In general, by performing a number of such enlarged transfer steps in each of which the devices are enlargedly spaced from each other, the number of transfers can be reduced. For example, it is now assumed that an enlargement ratio between the pitch of the devices 22 on the temporary holding member 21 and the pitch of the devices 22 on the first substrate 20 is taken as 2 (n=2) and an enlargement ratio between the pitch of the devices 22 on the second substrate 25 and the pitch of the devices 22 on the temporary holding member 21 is taken as 2 (m=2). In this case, the total enlargement ratio becomes 2×2=4. To achieve the total enlargement ratio (=4), according to a one-step transfer method, the number of transfers (alignment) of the devices 22 from the first substrate 20 to the second substrate 25 becomes 16 times as a result of squaring the total enlargement ratio (=4). On the contrary, to achieve the same total enlargement ratio (=4) according to the two-step enlarged transfer method of this embodiment, the number of transfers (alignment) is obtained by simply adding a square of the enlargement ratio (=2) in the second transfer step to a square of the enlargement ratio (=2) in the first transfer step, and therefore, the number of transfers becomes eight times as a result of adding 4 ($2^2$) to 4 ($2^2$). Generally, to achieve the transfer magnification of n×m, according to the two-step enlarged transfer method, the number of transfer becomes ($n^2+m^2$) times, whereas according to the one-step transfer method, the number of transfers becomes $(n+m)^2=n^2+2$ nm+$m^2$. Consequently, according to the two-step enlarged transfer method, the number of transfers can be reduced by 2 nm times, and the time and the cost required for the production step can be correspondingly saved. This is particularly advantageous in the case of transfer at a larger transfer magnification (enlargement ratio).

Figure 13:
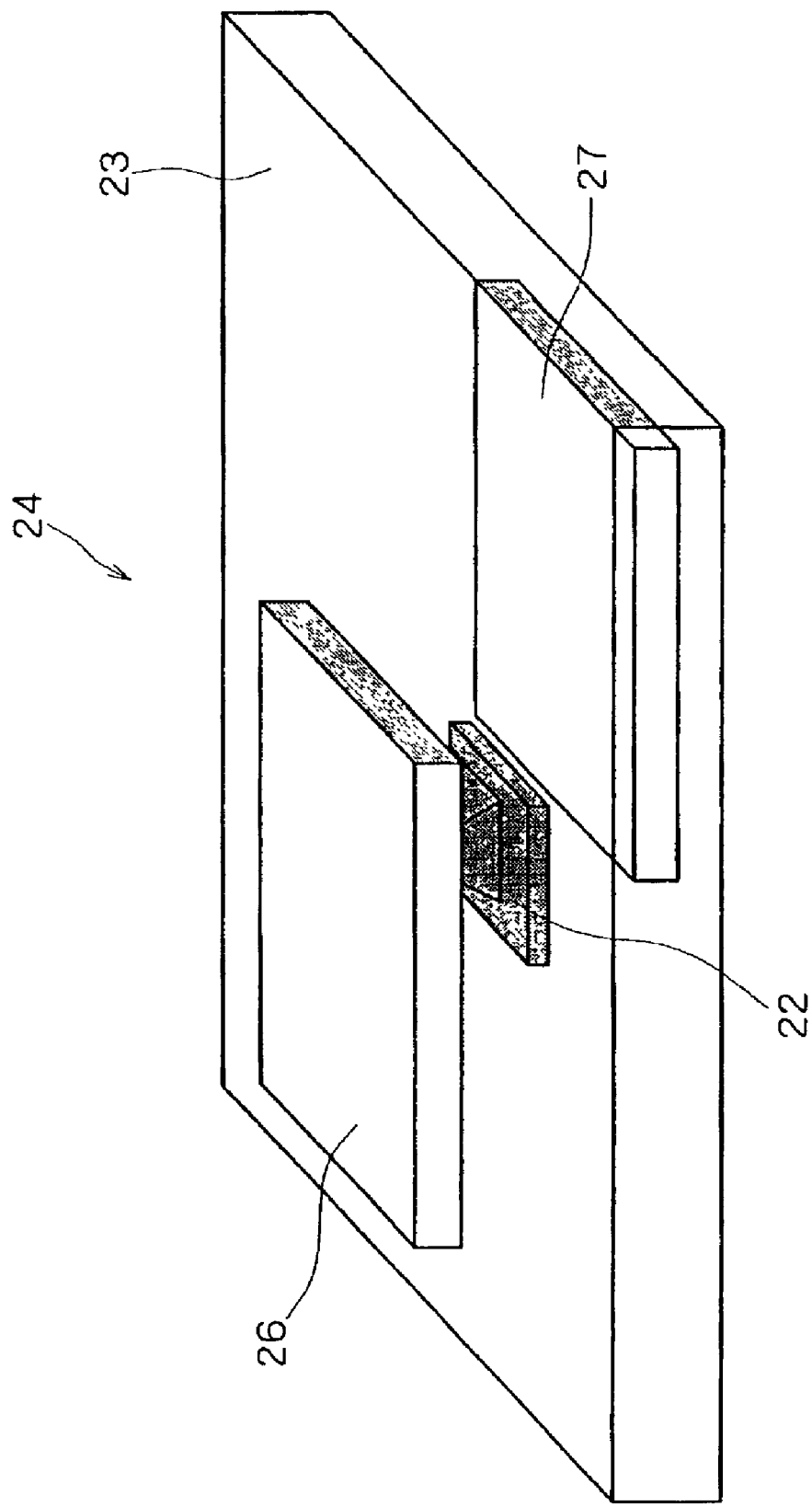
FIG. 13 is a schematic perspective view showing a resin-covered chip.
Figure 14:
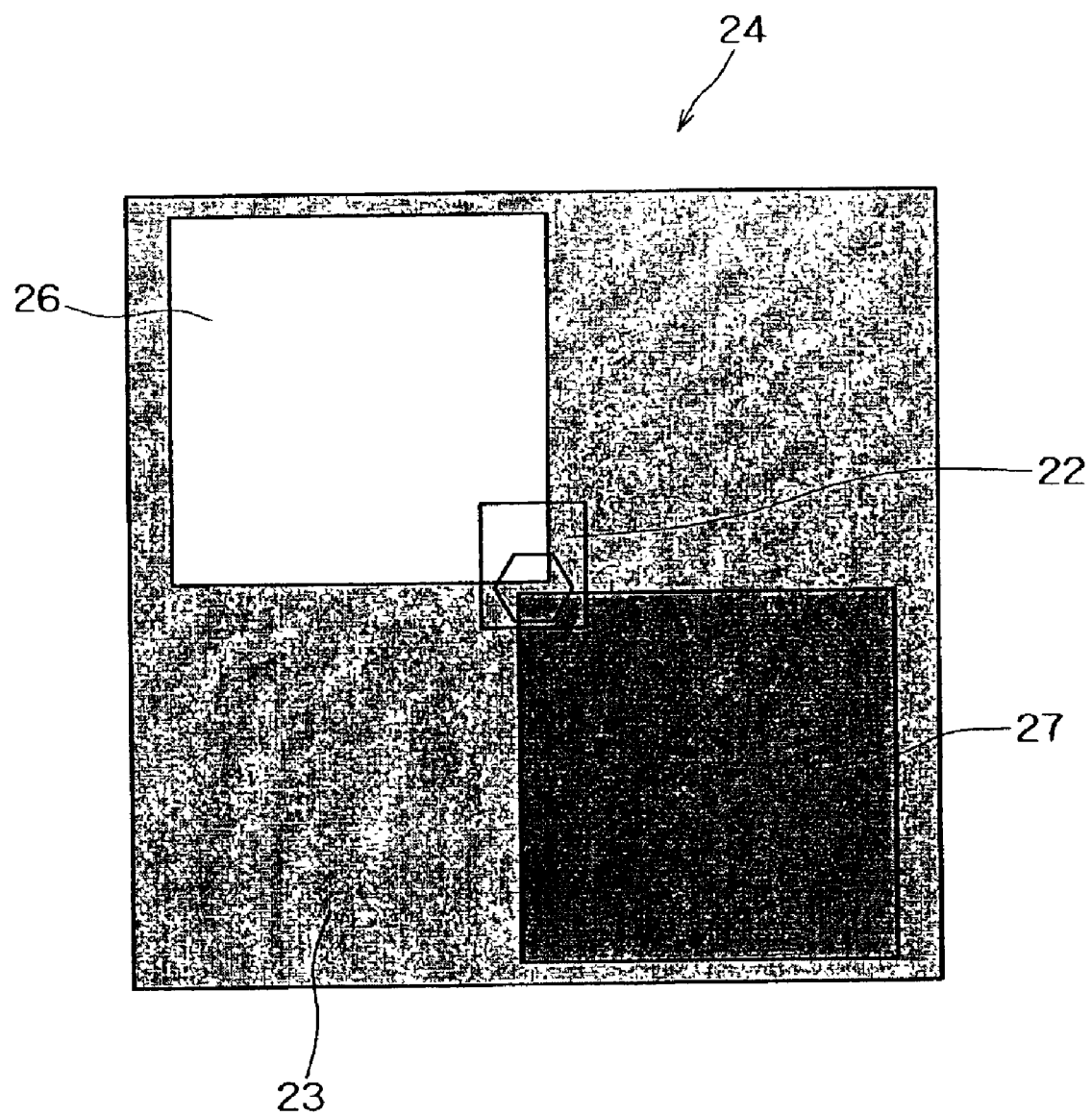
FIG. 14 is a schematic plan view showing the resin-covered chip shown in FIG. 13.

The resin-covered chip 24 used as the display device in the above-described two-step enlarged transfer method will be described below. As shown in FIGS. 13 and 14, the resin-covered chip 24 is formed into an approximately flat plate shape with an approximately square shaped principal plane. The resin-covered chip 24 is formed by covering the device 22 with a cured resin 23. More specifically, a number of the resin-covered chips 24 are obtained by coating the overall surface of the temporary holding member 21 so as to cover the devices 22 with a non-cured resin, curing the resin, and cutting the cured resin 23 into approximately square chips by dicing.

Electrode pads 26 and 27 are formed on front and back surfaces of the approximately flat plate-like resin 23 of the resin-covered chip 24, respectively. These electrode pads 26 and 27 are each produced by forming a conductive layer made from a metal or polysilicon as a material of each of the electrode pads 26 and 27 overall on each of the front and back surfaces of the resin 23, and patterning the conductive layer into specific electrode shapes by photolithography. These electrode pads 26 and 27 are formed so as to be connected to a p-electrode and an n-electrode of the device 22 as the light emitting device, respectively. If needed, via-holes may be formed in the resin 23 of the resin-covered chip 24.

The electrode pads 26 and 27 are formed, in this embodiment, on the front and back surface sides of the resin-covered chip 24, respectively. However, they may be formed on either of the front and back surface sides of the resin-covered chip 24. It is to be noted that the electrode pads 26 and 27 are offset from each other in a plan view in order to prevent the electrode pads 26 and 27 from being overlapped to each other when a contact hole is formed from above at the time of formation of final wiring. The shape of each of the electrode pads 26 and 27 is not limited to a square shape but may be any other shape.

The formation of such a resin-covered chip 24 is advantageous in that, since the device 22 is covered with the flattened resin 23, the electrode pads 26 and 27 can be accurately formed on the flattened front and back surfaces of the resin 23, and the electrode pads 26 and 27 can be formed so as to extend to a region wider than the size of the device 22, thereby facilitating the handling of the device 22 by an attracting jig in the second transfer step. As will be described later, since final wiring is performed after the second transfer step, a wiring failure can be prevented by performing wiring using the electrode pads 26 and 27 having relatively large sizes.

Figure 15A:
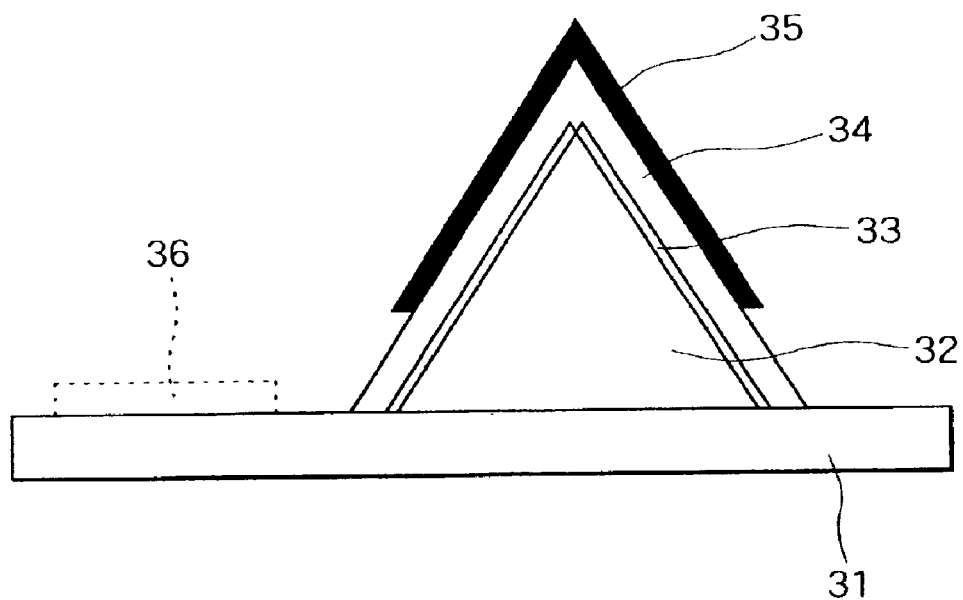
FIGS. 15A and 15B are a sectional view and a plan view showing one example of a light emitting device, respectively.
Figure 15B:
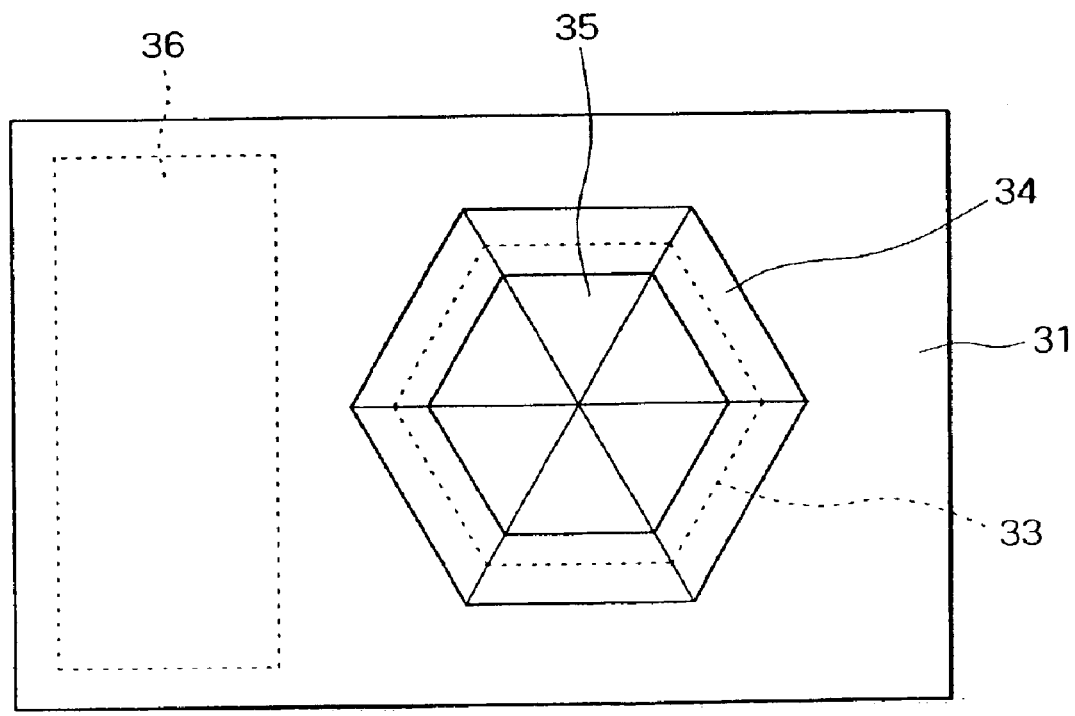

FIGS. 15A and 15B show a structure of a light emitting device as one example of the device used in the above-described two-step enlarged transfer method, wherein FIG. 15A is a sectional view of the device and FIG. 15B is a plan view of the device. The light emitting device shown is exemplified by a GaN based light emitting diode formed, for example, on a sapphire substrate by crystal growth. In this GaN based light emitting diode, when the light emitting diode is irradiated with a laser beam passing through the substrate, laser abrasion occurs, to evaporate nitrogen of GaN, thereby causing film peeling at an interface between the sapphire substrate and a GaN based growth layer. As a result, device peeling can be performed easily.

The structure of the GaN based light emitting diode will be described below. A hexagonal pyramid shaped GaN layer 32 is formed by selective growth on an under growth layer 31 composed of a GaN based semiconductor layer. An insulating film (not shown) is formed on the under growth layer 31, and the hexagonal pyramid shaped GaN layer 32 is grown from an opening formed in the insulating film by a MOCVD process or the like. The GaN layer 32 is a growth layer having a pyramid shape covered with a S-plane; that is, (1-101) plane when a principal plane of a sapphire substrate used for growth is-taken as a C-plane. The GaN layer 32 is a region doped with silicon. The tilt S-plane portion of the GaN layer 32 functions as a cladding portion of a double-hetero structure. An InGaN layer 33 functioning as an active layer is formed in such a manner as to cover the tilt S-plane of the GaN layer 32. A GaN layer 34 doped with magnesium is formed on the InGaN layer 33. The GaN layer 34 doped with magnesium also functions as a cladding portion.

The light emitting diode has a p-electrode 35 and an n-electrode 36. A metal material such as Ni/Pt/Au or Ni(Pd)/Pt/Au is vapor-deposited on the GaN layer 34 doped with magnesium to form the p-electrode 35. A metal material such as Ti/Al/Pt/Au is vapor-deposited in an opening formed in the above-described insulating film (not shown) to form the n-electrode 36. In the case of extracting an n-electrode from a back surface side of the under growth layer 31, the n-electrode 36 is not required to be formed on the front surface side of the under growth layer 31.

The GaN based light emitting diode having such a structure enables light emission of blue. In particular, such a light emitting diode can be relatively simply peeled from the sapphire substrate by laser abrasion. In other words, the diode can be selectively peeled by selective irradiation of the diode with a laser beam. In addition, the GaN based light emitting diode may have a structure that an active layer be formed into a planar or strip shape, or may be a pyramid structure with a C-plane formed on an upper end portion of the pyramid. The GaN light emitting diode also may be replaced with any other nitride based light emitting device or a compound semiconductor device.

Figure 16:
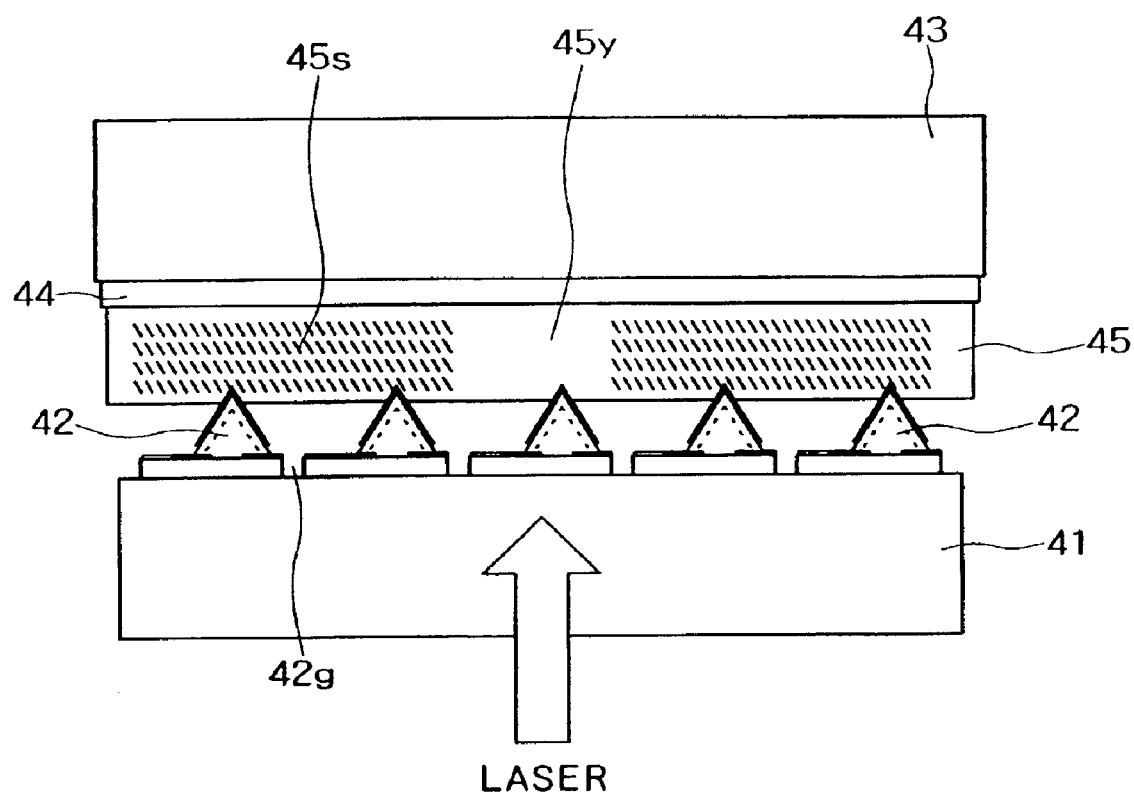
FIG. 16 is a schematic sectional view showing a first transfer step of a method of arraying the light emitting devices shown in FIGS. 15A and 15B by a two-step enlarged transfer method.

A method of arraying the light emitting devices shown in FIGS. 15A and 15B will be described below with reference to FIGS. 16 to 22. First, as shown in FIG. 16, a number of light emitting diodes 42 are formed in a matrix on a principal plane of a first substrate 41. A size of the light emitting device 42 is set to about 20 $\mu$m. The first substrate 41 is made from a material; for example, sapphire substrate having a high transmittance for a laser beam having a specific wavelength suitably used for irradiation of the light emitting diode 42. The light emitting diodes 42 are in the state that electrodes such as p-electrodes already have been formed, but final wiring is not yet performed, and that device isolation grooves 42g are formed, whereby the light emitting diodes 42 are isolatable from each other. The grooves 42g are formed, for example, by reactive ion etching. As shown in FIG. 16, such a first substrate 41 is placed opposite to a temporary holding member 43 for selective transfer of the light emitting diodes 42 therebetween.

Both a release layer 44 and an adhesive layer 45 are formed on a surface, opposed to the first substrate 41, of the temporary holding member 43. The temporary holding member 43 may be made from glass substrate, quartz glass substrate, or plastic substrate. The release layer 44 on the temporary holding member 43 can be made from a fluorine coat material, a silicone resin, a water soluble adhesive (for example, polyvinyl alcohol: PVA), or polyimide. The adhesive layer 45 on the temporary holding member 43 can be made from an ultraviolet (UV)-curing type adhesive, a thermosetting type adhesive, or a thermoplastic type adhesive. As one example, a quartz glass substrate is used as the temporary holding member 43, and a polyimide film is formed as the release layer 44 on the temporary holding member 43 to a thickness of 4 $\mu$m and an UV-curing type adhesive layer is formed as the adhesive layer 45 on the release layer 44 to a thickness of about 20 $\mu$m.

The adhesive layer 45 on the temporary holding member 43 is adjusted such that cured regions 45s and non-cured regions 45y are mixed. The first substrate 41 is positioned to the temporary holding member 43 such that the light emitting diodes 42 to be selectively transferred are located at the non-cured regions 45y. The adjustment of the adhesive layer 45 in such a manner that the cured regions 45s and the non-cured regions 45y are mixed may be performed by selectively exposing a UV-curing type adhesive with a pitch of 200 $\mu$m by an exposure system, so that portions of the adhesive layer 45 to which the light emitting diodes 42 are to be transferred remain non-cured and the other portions are cured. After such selective curing of the adhesive layer 45, each of the light emitting diodes 42 to be transferred is irradiated with a laser beam from the back surface of the first substrate 41, and is then peeled from the first substrate 41 by laser abrasion. Since the GaN based light emitting diode 42 is decomposed into gallium and nitrogen at the interface between the GaN layer and sapphire, the light emitting diode 42 can be relatively simply peeled from the first substrate 41. The laser beam used for irradiation is exemplified by an excimer laser beam or a harmonic YAG laser beam.

The light emitting diode 42, which has been selectively irradiated with a laser beam, is peeled from the first substrate 41 at the interface between the GaN layer and the first substrate 41 by laser abrasion, and is transferred to the opposed temporary holding member 43 in such a manner that the p-electrode portion of the light emitting diode 42 is pieced in the corresponding non-cured region 45y of the adhesive layer 45. The other light emitting diodes 42, which are not irradiated with laser beams and located at positions corresponding to the cured region 45s of the adhesive layer 45, are not transferred to the temporary holding member 43. It is to be noted that, in the example shown in FIG. 16, only one light emitting diode 42 is selectively irradiated with a laser beam. However, in actuality, the light emitting diodes 42 spaced from each other with an n-pitch are similarly irradiated with laser beams. With such selective transfer, the light emitting diodes 42 are arrayed on the temporary holding member 43 in such a manner as to be enlargedly spaced from each other with a pitch larger than an original pitch of the light emitting diodes 42 arrayed on the first substrate 41.

Figure 17:
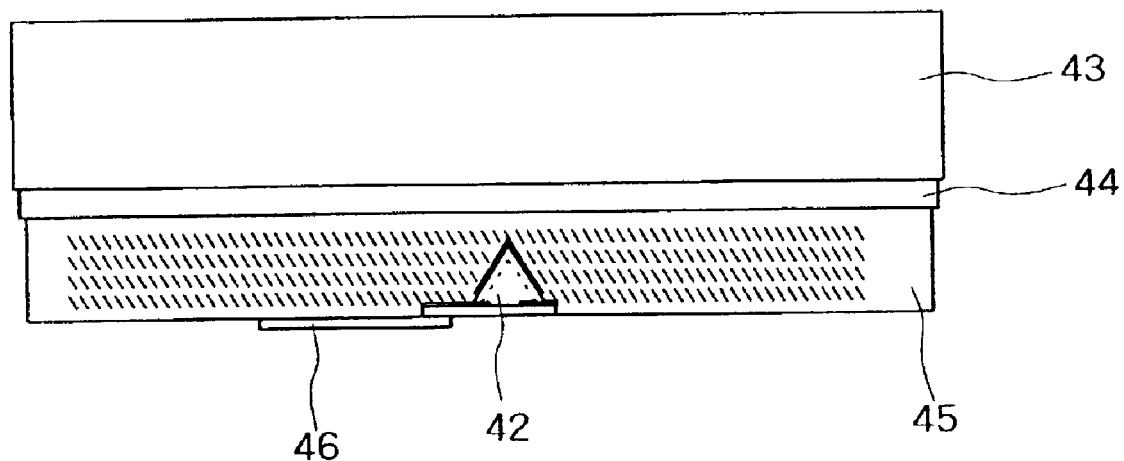
FIG. 17 is a schematic sectional view showing an electrode pad formation step subsequent to the step shown in FIG. 16.

In the state that the light emitting diode 42 is held by the adhesive layer 45 of the temporary holding member 43, the back surface of the light emitting diode 42, which is taken as an n-electrode side (cathode electrode side), is cleaned for removal of the resin (adhesive) therefrom. Accordingly, when an electrode pad 46 is formed on the back surface of the light emitting diode 42 as shown in FIG. 17, it can be electrically connected thereto.

The cleaning of the adhesive layer 45 may be performed, for example, by etching the resin used as the adhesive with oxygen plasma and cleaning it by irradiation of UV ozone. When the GaN based light emitting diode is peeled from the first substrate 41 made from sapphire substrate by laser irradiation, gallium is deposited on the peeling plane. Such an element Ga must be etched, for example, by using an NaOH containing water solution or dilute nitric acid. The electrode pad 46 is then formed by patterning. The electrode pad 46 on the cathode side can be formed into a size of about 60 $\mu$m square. As the electrode pad 46, there can be used a transparent electrode (ITO or ZnO based electrode) or a Ti/Al/Pt/Au electrode. In the case of using such a transparent electrode, even if the electrode largely covers the back surface of the light emitting diode, it does not shield light emission. Accordingly, a patterning accuracy of the transparent electrode may be rough and the size of the electrode can be made large, to thereby facilitate the patterning process.

After the formation of the electrode pad 46, the cured adhesive layer 45 is cut for each light emitting diode 42 into each resin-covered chip containing the light emitting diode 42. The dicing process is made by mechanical dicing or laser dicing. A cut-in width by dicing is dependent on the size of the light emitting diode 42 covered with the adhesive layer 45 within a pixel of an image display unit. If a cut-in width being as narrow as 20 μm or less is needed, the dicing is required to be performed by laser dicing using a laser beam such as an excimer laser beam, a harmonic YAG laser beam, or a carbon dioxide laser beam.

Figure 18:
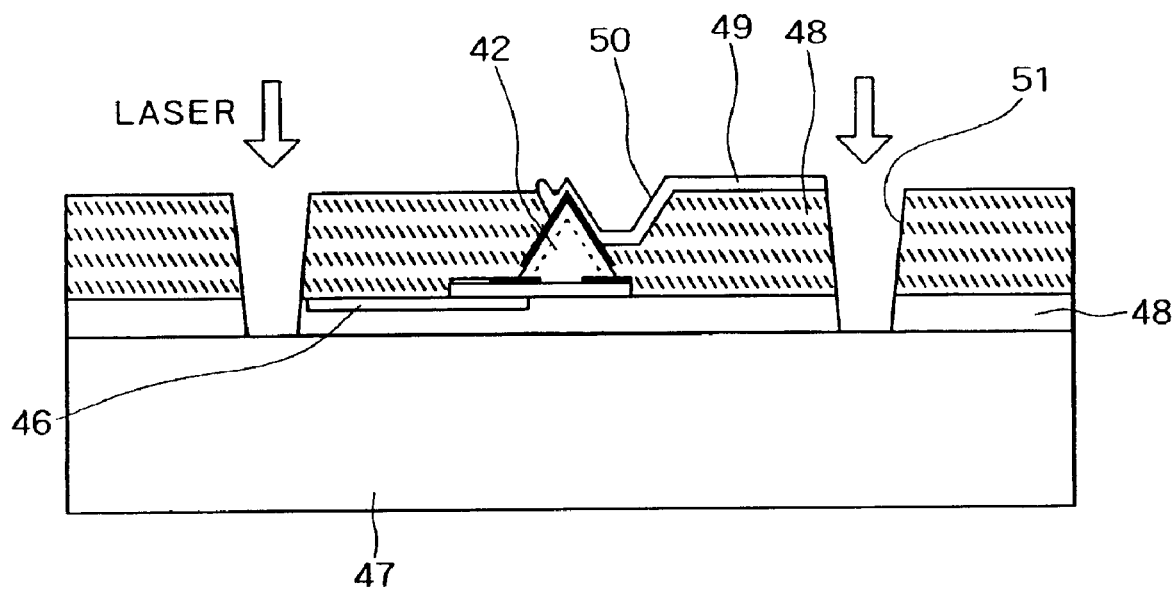
FIG. 18 is a schematic sectional view showing an electrode pad formation step and a dicing step after transfer to a second temporary holding member, which steps are subsequent to the step shown in FIG. 17.

Referring to FIG. 18, after the light emitting diode 42 is transferred from the temporary holding member 43 to a second temporary holding member 47, a via-hole 50 on an anode electrode (p-electrode) side is formed in the adhesive layer 45 and an anode side electrode pad 49 is formed so as to be buried in the via-hole 50. The adhesive layer 45 made from the resin is then diced. As a result of dicing, device isolation grooves 51 are formed to isolate the light emitting diode 42 from the adjacent light emitting diodes 42. To isolate the light emitting diodes 42 arrayed in a matrix from each other, the device isolation grooves 51 have a planar pattern composed of a number of parallel lines extending in the vertical and horizontal directions. From the bottom of the device isolation groove 51, the front surface of the second temporary holding member 47 is exposed. The second temporary holding member 47 is exemplified by a so-called dicing sheet composed of a plastic substrate coated with an UV adhesive whose adhesive strength becomes weak by irradiation of ultraviolet rays.

In the above-described transfer, the release layer 44 is irradiated with an excimer laser from the back surface, opposed to the release layer 44 side, of the temporary holding member 43. If the release layer 44 is made from polyimide, the release layer 44 is peeled by abrasion of polyimide, with a result that each light emitting diode 42 is transferred to the second temporary holding member 47. In one example of the process of forming the anode electrode pad 49, the surface of the adhesive layer 45 is etched with oxygen plasma until the surface of the light emitting diode 42 is exposed. The via-hole 50 may be formed by using an excimer laser, a harmonic YAG laser beam, or a carbon dioxide laser beam. The diameter of the via-hole 50 is set to about 3 to 7 μm. The anode side electrode pad 49 is made from Ni/Pt/Au.

The light emitting diode 42 is peeled from the second temporary holding member 47 via a mechanical process. A release layer 48 has been formed on the second temporary holding member 47. The release layer 48 can be made from a fluorine coat material, a silicone resin, a water soluble resin (for example, PVA), polyimide, or the like. The release layer 48 is irradiated with, for example, a YAG third harmonic laser beam from the back surface, opposed to the release layer 48 side, of the second temporary holding member 47. If the release layer 48 is made from polyimide, peeling occurs at the interface between polyimide and the quartz substrate by abrasion of polyimide. As a result, the light emitting diode 42 can be peeled easily from the second temporary holding member 47 via the mechanical process.

Figure 19:
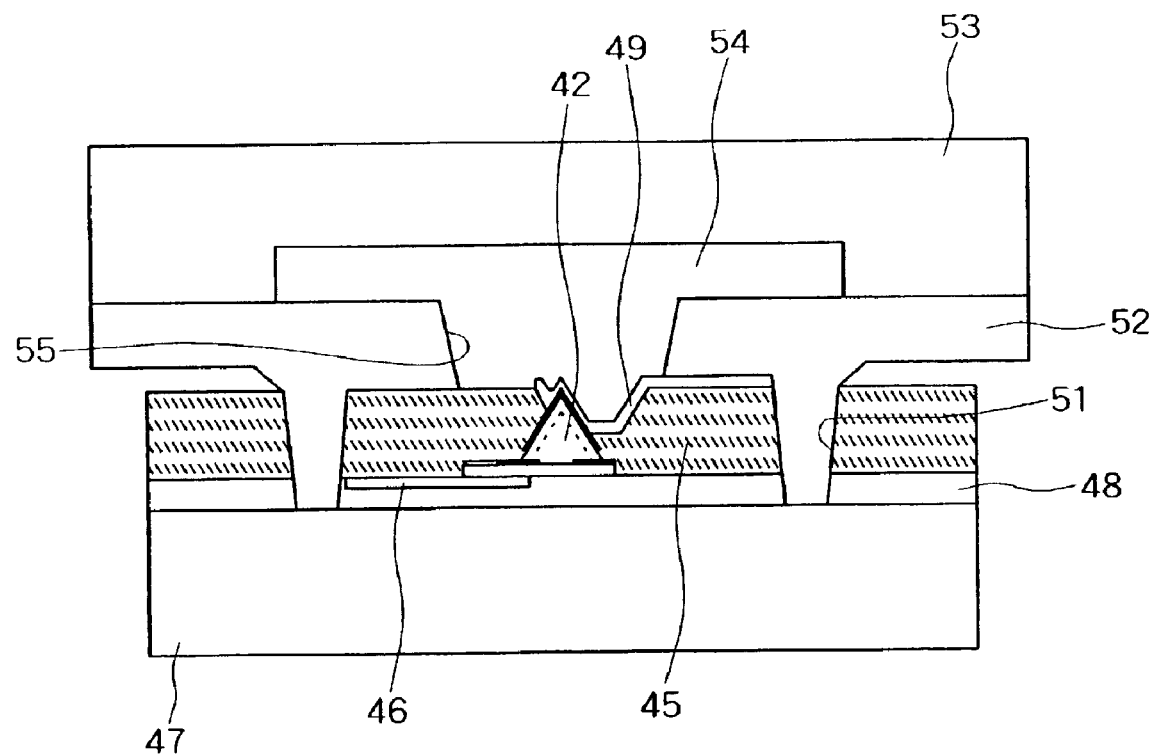
FIG. 19 is a schematic sectional view showing an attracting step subsequent to the steps shown in FIG. 18.

FIG. 19 shows a state that each of the light emitting diodes 42 arrayed on the second temporary holding member 47 is picked up via an attracting system 53. The attracting system 53 has attracting holes 55 opened in a matrix having a pitch corresponding to a pixel pitch of an image display unit in order to collectively attract a number of the light emitting diodes 42. The attracting holes 55, for example, each having an opening diameter of about 100 μm, are arranged into a matrix with a pitch of 600 μm, and the attracting system 53 can collectively attract 300 pieces of the light emitting diodes 42. The attracting hole 55 portion is obtained by forming a hole in a metal plate 52, which is made from Ni or stainless steel (SUS), by etching. It is to be noted that the metal plate 52 made from Ni is produced by electrocasting. An attracting chamber 54 is formed at the depth of the attracting hole 55 formed in the metal plate 52. By controlling the pressure in the attracting chamber 54 into a negative pressure, the attracting system 53 can attract the light emitting diode 42. Since each light emitting diode 42 is in a state covered with the resin 23 whose surface is nearly flattened, the selective attraction of the light emitting diode 42 by the attracting system 53 can be performed easily.

Figure 20:
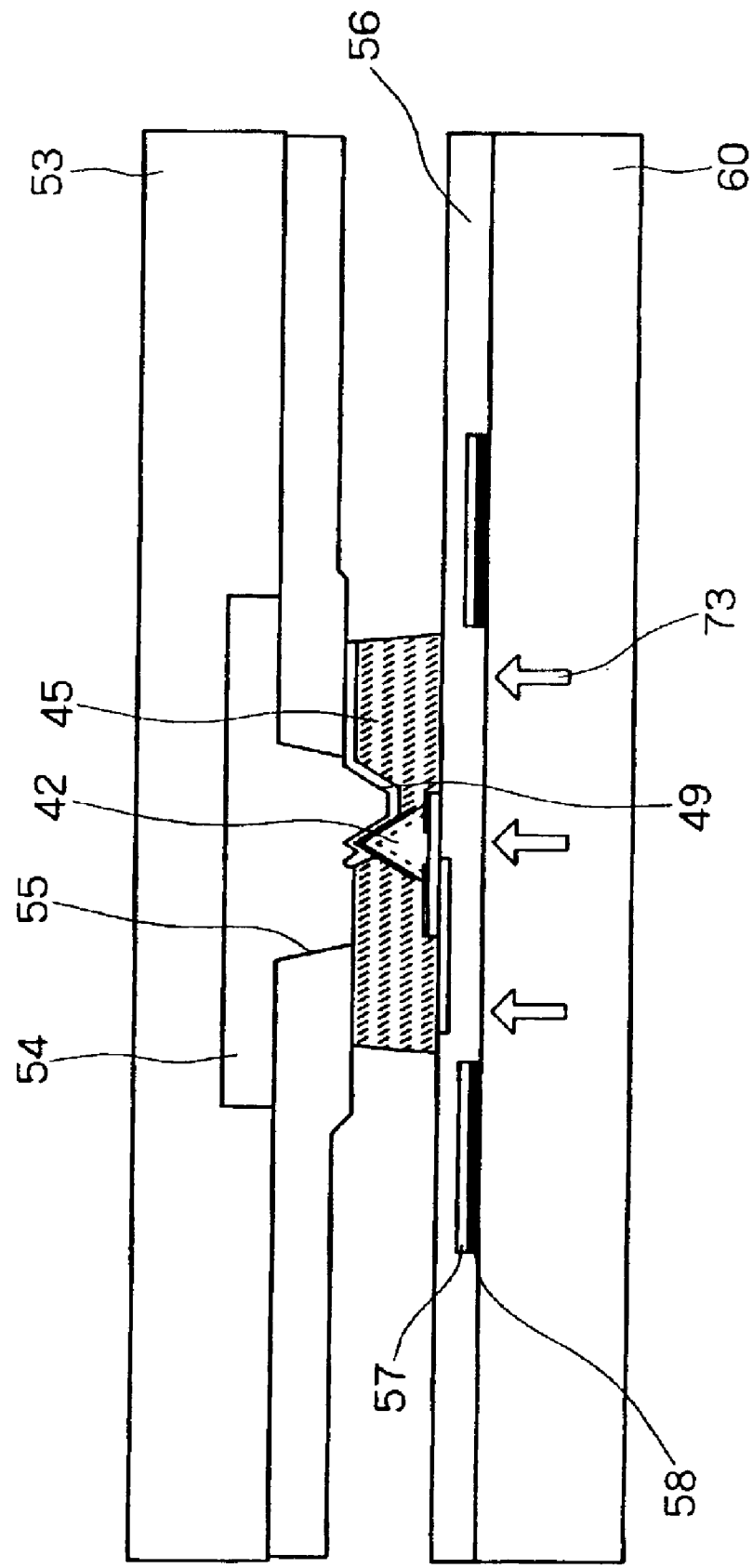
FIG. 20 is a schematic sectional view showing a second transfer step subsequent to the step shown in FIG. 19.

FIG. 20 is a view showing a state that the light emitting diode 42 is transferred to a second substrate 60. An adhesive layer 56 is previously formed on the second substrate 60 before the light emitting diode 42 is transferred to the second substrate 60. By curing a portion, located on the back surface of the light emitting diode 42, of the adhesive layer 56, the light emitting diode 42 can be fixedly placed on the second substrate 60. Upon this mounting, the pressure of the attracting chamber 54 of the attracting system 53 becomes high, to release the coupling state between the light emitting diodes 42 and the attracting system 53 by attraction.

The adhesive layer 56 is made from an UV-curing type adhesive, a thermosetting adhesive, or a thermoplastic adhesive. Here, the adhesive layer 56 becomes a sealing material covering the surface of the light emitting diode 42. Therefore, the adhesive layer 56 is given the above-described light diffusion function. For example, light-diffusion beads are diffused in the adhesive layer 56, or bubbles are periodically formed in the adhesive layer 56. Alternatively, a combination of a reflection mirror and a half mirror is formed in the adhesive layer 56.

The light emitting diodes 42 thus arrayed on the second substrate 60 are enlargedly spaced from each other with a pitch larger than each of the pitch of the light emitting diodes 42 held on the first temporary holding member 43 and the pitch of the light emitting diodes 42 held on the second temporary holding member 47. An energy (a beam 73) for curing the resin of the adhesive layer 56 is given from the back surface of the second substrate 60. A portion, located on the back surface of the light emitting diode 42, of the adhesive layer 56 may be cured by using ultraviolet rays if the adhesive layer 56 is made from a UV-curing type adhesive or cured by using a laser beam if the adhesive layer 56 is made from a thermosetting adhesive, to be adhesively bonded to the light emitting device 42. Alternatively, a portion, located on the back surface of the light emitting diode 42, of the adhesive layer 56 may be melted by laser irradiation if the adhesive layer 56 is made from a thermoplastic adhesive, to be adhesively bonded to the light emitting diode 42.

An electrode layer 57, which also functions as a shadow mask, is disposed on the second substrate 60. In particular, a black chromium layer 58 is formed on the screen side surface; that is, on the viewer side surface of the electrode layer 57. An advantage of provision of the black chromium layer 58 is to improve the contrast of an image. Another advantage of provision of the black chromium layer 58 is that the higher energy absorptivity of the black chromium layer 58 allows a portion of the adhesive layer 56 selectively irradiated with the beam 73 to be cured faster. If the adhesive layer 56 is made from an UV-curing type adhesive, it may be irradiated with ultraviolet rays having an energy of about 1,000 μmJ/cm².

Figure 21:
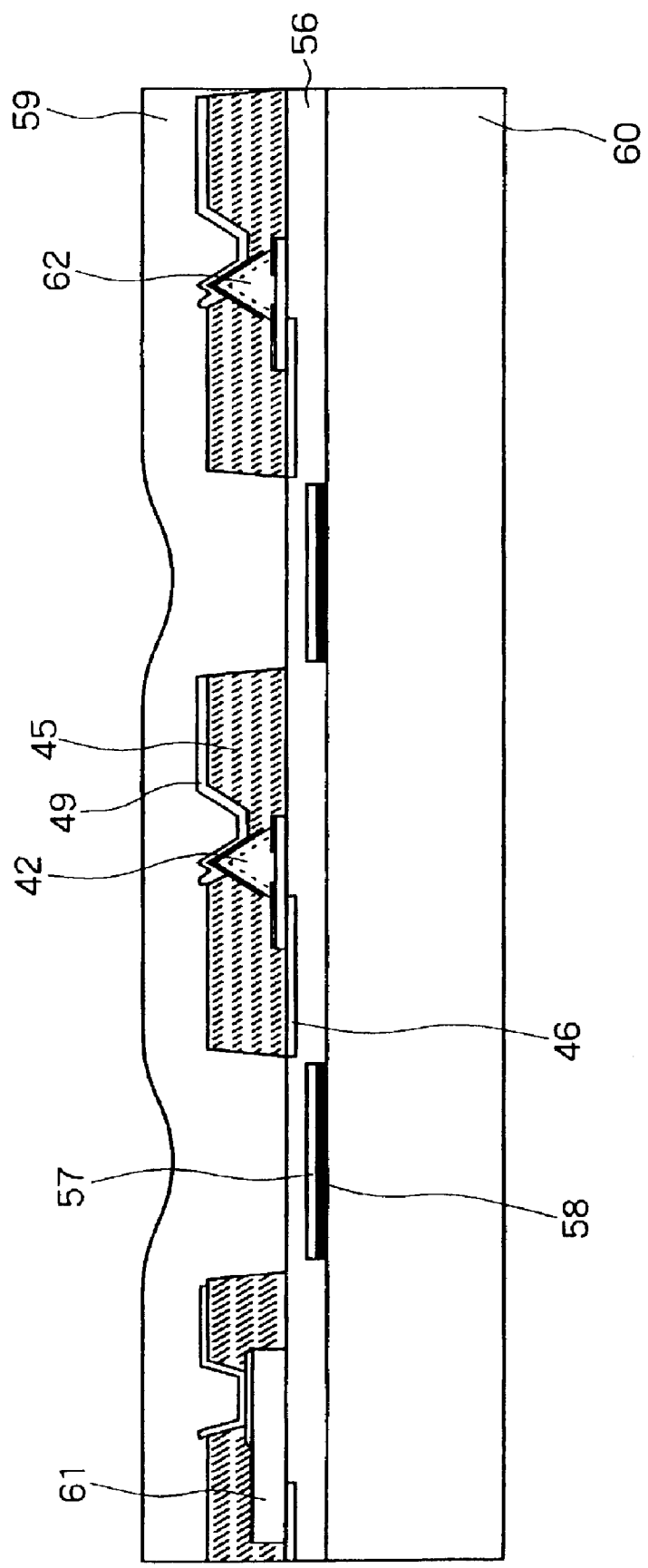
FIG. 21 is a schematic sectional view showing an insulating layer formation step subsequent to the step shown in FIG. 20.

FIG. 21 is a view showing a state that light emitting diodes 42, 61, and 62 of three colors, RGB are arrayed on the second substrate 60 and are coated with an insulating layer 59. By mounting the light emitting diodes 42, 61, and 62 on the second substrate 60 at respective positions of the three colors by the attracting system 53 shown in FIGS. 19 and 20, a pixel composed of the light emitting diodes 42, 61 and 62 of the three colors can be formed with a pitch of the pixel fixed. The insulating layer 59 may be made from a transparent epoxy adhesive, UV-curing type adhesive, or polyimide. The shapes of the light emitting diodes 42, 61, and 62 of the three colors are not necessarily identical to each other. In the example shown in FIG. 21, the red light emitting diode 61, which has a structure having no hexagonal pyramid shaped GaN layer, is different in shape from each of the other light emitting diodes 42 and 62. However, in this stage, each of the light emitting diodes 42, 61, and 62 already has been covered with the resin 23 to be thus formed into a resin-covered chip. Therefore, the light emitting diodes 42, 61, and 62 can be handled in the same manner irrespective of the difference in device structure.

Figure 22:
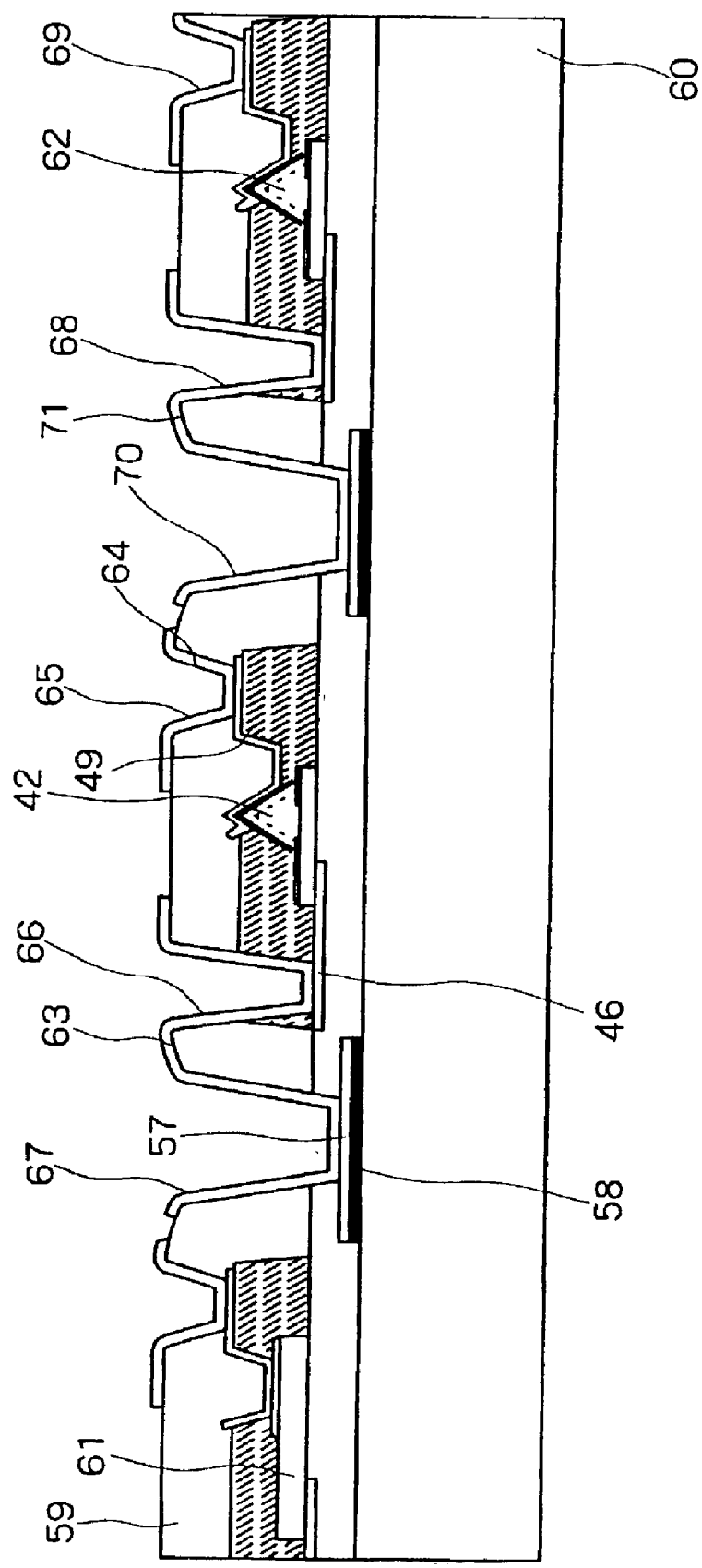
FIG. 22 is a schematic sectional view showing a wiring formation step subsequent to the step shown in FIG. 21.

As shown in FIG. 22, to electrically connect the electrode pads 46 and 49 of each of the light emitting diodes 42, 61 and 62 to the electrode layer 57 on the second substrate 60, opening portions (via-holes) 65, 66, 67, 68, 69, and 70 are formed in the insulating layer 59, followed by formation of wiring portions as will be described later. The formation of the opening portions is performed, for example, by using a laser beam. Since the areas of the electrode pads 46 and 49 of each of the light emitting diodes 42, 61, and 62 are large, the shapes of the opening portions, that is, via-holes 65, 66, 67, 68, 69 and 70 can be made large. As a result, the positioning accuracy of each via-hole may be made rough as compared with the case where a via-hole is directly formed in each light emitting diode. For example, for each of the electrode pads 46 and 49 having a size of about 60 μm square, the via-hole having a diameter of about 20 μm can be formed. The via-holes have three types having different depths: the first type is for connection to the second substrate (wiring substrate), the second type is for connection to the anode electrode, and the third type is for connection to the cathode electrode. The depth of each via-hole is optimized by controlling the pulse number of a laser beam depending on the type of the via-hole.

After the opening portions 65, 66, 67, 68, 69 and 70 are formed in the insulating layer 59, wiring portions 63, 64, and 71 are formed for connecting the electrode pads already connected to the anodes and cathodes of the light emitting diodes 42, 61 and 62 to the wiring electrode layer 57 formed on the second substrate 60. A protective layer is then formed on the wiring to accomplish a panel of an image display unit. The protective layer may be made from the same transparent epoxy adhesive as that used for the insulating layer 59 shown in FIG. 21. The protective layer is heated to be cured to perfectly cover the wiring. After that, a driver IC is connected to the wiring at the end portion of the panel to produce a drive panel.

According to the method of arraying light emitting devices described above, since the light emitting diodes 42 have been held on the temporary holding member 43 in the state being enlargedly spaced from each other, the relatively large electrode pads 46 and 49 can be provided on each of the diodes 42 by making use of the large distance between adjacent each of the diodes 42, and since the wiring is performed by making use of the relatively large electrode pads 46 and 49, even if the size of the final unit is significantly larger than the device size, the wiring can be formed easily. Also, according to the method of arraying light emitting devices in this embodiment, since each light emitting diode 42 is covered with the flattened, cured adhesive layer 45, the electrode pads 46 and 49 can be accurately formed on the flattened front and back surfaces of the adhesive layer 45 and also can be disposed to extend to a region wider than the device size, so that the handling of the light emitting diode 32 by the attracting jig in the second transfer step can be facilitated.

Figure 23:
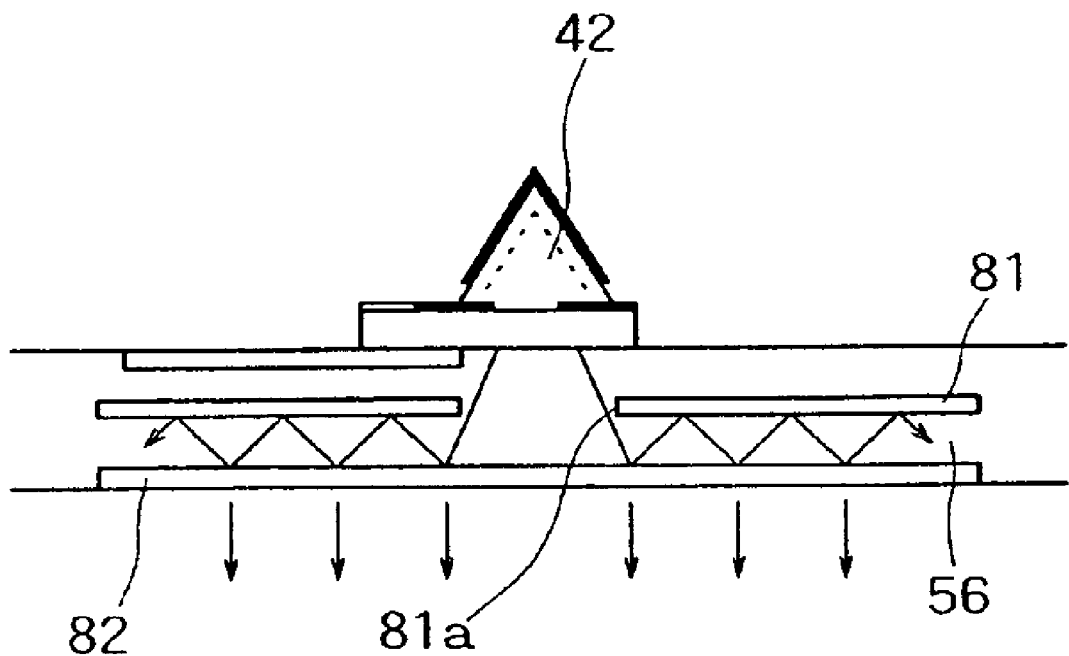
FIG. 23 is a schematic sectional view showing the specific embodiment in which a reflection mirror and a half mirror are formed in the display unit produced by the two-step enlarged transfer method.

In the display unit produced as described above, the light emitting diodes 42 are arrayed on the second substrate 60 in such a manner as to be enlargedly spaced from each other with a pitch larger than the size of each of the diodes 42. To improve the display quality of such a display unit, according to this embodiment, light emission regions of the light emitting devices 42 are enlarged by giving a light diffusion function to the sealing material (adhesive layer 56 in this embodiment) on the outermost surface for covering the light emitting diodes 42. FIG. 23 shows a state that a reflection mirror 81 having an opening 81a is formed at a position, near the light emitting diode 42, of the adhesive layer 56, and a half mirror 82 is formed on the surface, on the second substrate 60 side, of the adhesive layer 56. Light rays emitted from the light emitting diode 42 are repeatedly reflected from the half mirror 82 while partially passing therethrough, to be spread in the in-plane direction. It is to be noted that, as described above, in place of the combination of the reflection mirror 81 and the half mirror 82, light-diffusion beads may be dispersed in the adhesive layer 56 as shown in FIG. 8 to enlarge the light emission region of the light emitting device 42, or bubbles may be periodically formed in the adhesive layer 56 as shown in FIG. 10, to enlarge the light emission region of the light emitting device 42 on the basis of the principle of a photonic crystal.

As described above, according to the present invention, since a light diffusion function is given to a sealing material covering light emitting devices, the light emission region of each of the light emitting devices can be enlarged to a size nearly equal to the array pitch of the devices. As a result, it is possible to provide a display unit allowing an image display excellent in viewability. Also, according to the present invention, it is possible to moderate the light emission characteristic due to the shapes of the light emitting devices and hence to improve the uniformity of viewing angle, and further to improve the light emergence efficiency and to freely set the size of each pixel of the display unit.

Although the present invention has been described with reference to specific embodiments, those of skill in the art will recognize that changes may be made thereto without departing from the spirit and scope of the present invention as set forth in the hereafter appended claims.

What is claimed is:

1. A display unit, comprising:
   a plurality of light emitting devices arrayed so as to be spaced from each other; and
   a sealing material for covering surfaces of the light emitting devices, wherein the sealing material has a light diffusion function, wherein the light diffusion function of the sealing material is given by providing a reflection mirror and a half mirror in the sealing material, and wherein a size of a light emission region of each of the light emitting devices forming a pixel is controlled by adjusting one of a reflectance and a transmittance of the half mirror.

2. A display unit, comprising:

a plurality of light emitting devices arrayed so as to be spaced from each other; and a sealing material for covering surfaces of the light emitting devices, wherein the sealing material has a light diffusion function, wherein the light diffusion function of the sealing material is given by providing a reflection mirror and a half mirror in the sealing material, and wherein irregularities are formed on the half mirror.

* * * * *